United States Patent
Katayama

(10) Patent No.: US 6,750,476 B2
(45) Date of Patent: Jun. 15, 2004

(54) SUBSTRATE DEVICE MANUFACTURING METHOD AND SUBSTRATE DEVICE, ELECTROOPTICAL DEVICE MANUFACTURING METHOD AND ELECTROOPTICAL DEVICE AND ELECTRONIC UNIT

(75) Inventor: Shigenori Katayama, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 36 days.

(21) Appl. No.: 10/101,382

(22) Filed: Mar. 20, 2002

(65) Prior Publication Data

US 2002/0145140 A1 Oct. 10, 2002

(30) Foreign Application Priority Data

Mar. 23, 2001 (JP) ........................................ 2001-085751
Jan. 23, 2002 (JP) ........................................ 2002-014608

(51) Int. Cl.[7] .................... H01L 21/00; H01L 21/84; H01L 29/04; H01L 29/76

(52) U.S. Cl. ........................ 257/59; 257/68; 438/151; 438/455

(58) Field of Search ..................... 257/59, 68; 438/151, 438/455

(56) References Cited

U.S. PATENT DOCUMENTS

| | | | | |
|---|---|---|---|---|
| 6,146,992 A | * | 11/2000 | Lauterbach et al. | ........ 438/623 |
| 6,225,651 B1 | * | 5/2001 | Billon | ........................ 257/200 |
| 6,297,090 B1 | | 10/2001 | Kim | |
| 6,448,174 B1 | * | 9/2002 | Ramm | ........................ 438/637 |
| 6,556,265 B1 | * | 4/2003 | Murade | ...................... 349/111 |
| 6,586,161 B2 | * | 7/2003 | Futase et al. | ............... 430/311 |
| 2002/0003307 A1 | * | 1/2002 | Suga | ........................ 257/777 |

FOREIGN PATENT DOCUMENTS

| | | |
|---|---|---|
| KR | 2000-0013978 A | 3/2000 |
| KR | 2000-0038544 A | 7/2000 |

* cited by examiner

*Primary Examiner*—Alexander Ghyka
(74) *Attorney, Agent, or Firm*—Oliff & Berridge, PLC

(57) ABSTRACT

A substrate device has, on a substrate, a first conductive film, a first insulating film formed thereon, a second insulating film bonded thereon, and a second conductive film formed thereon. A contact hole connecting the first and second conductive films is opened so as to penetrate through a bonding interface thereof. The area of the contact hole penetrating through the bonding interface is not eroded by an etching solution. Thus, where manufacturing a substrate device in which a contact hole penetrating through a bonding interface needs to be formed, it is unlikely that a defect will occur in the area where the contact hole passing through the bonding interface, thereby enhancing device reliability and manufacturing yield.

18 Claims, 12 Drawing Sheets

FIG. 3
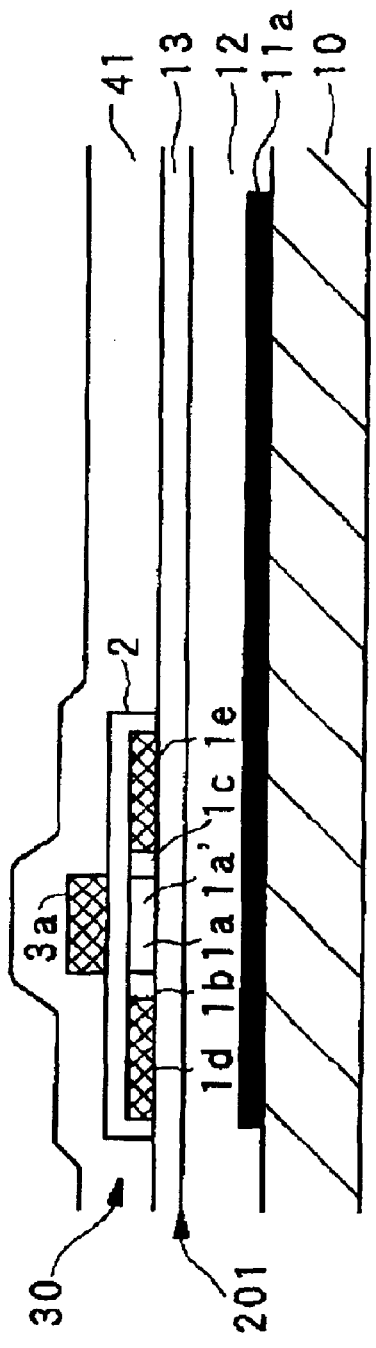
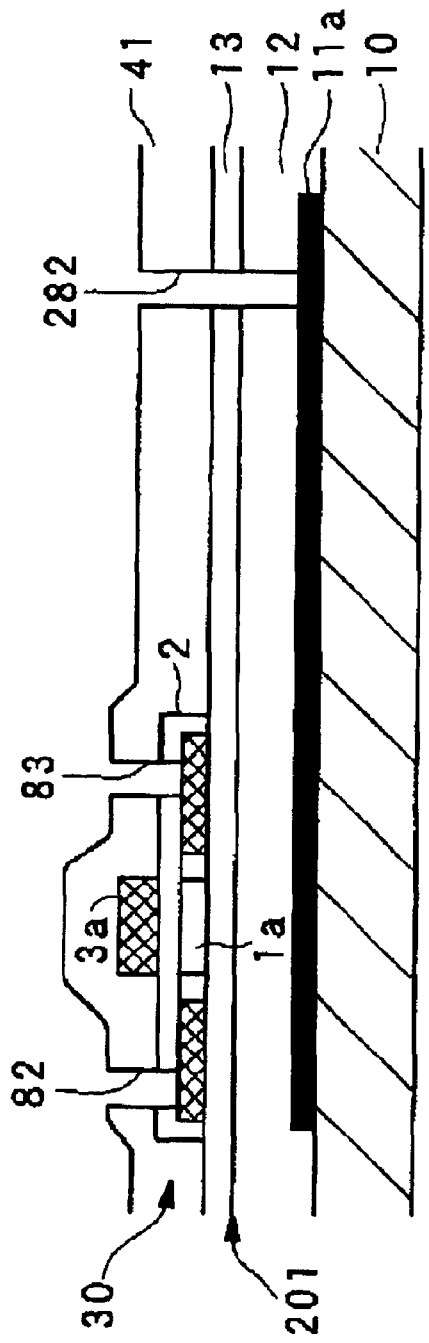

FIG. 4
(a)
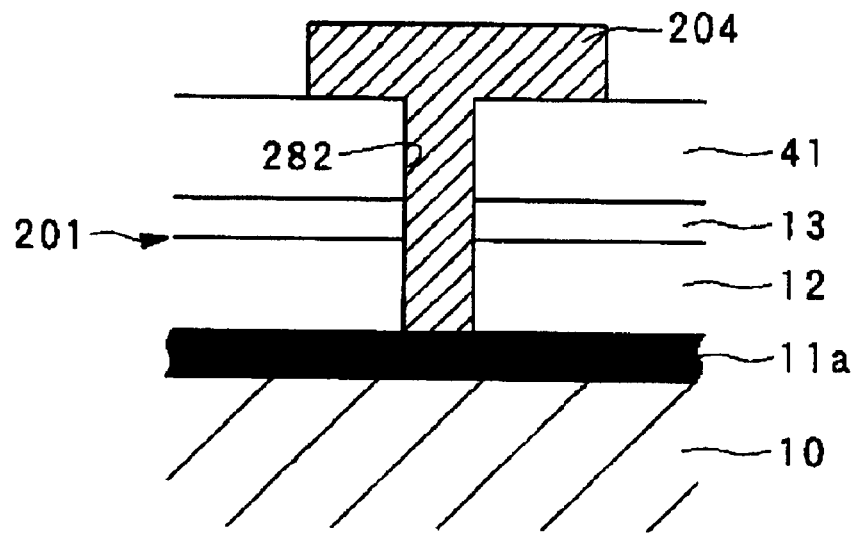
(b)
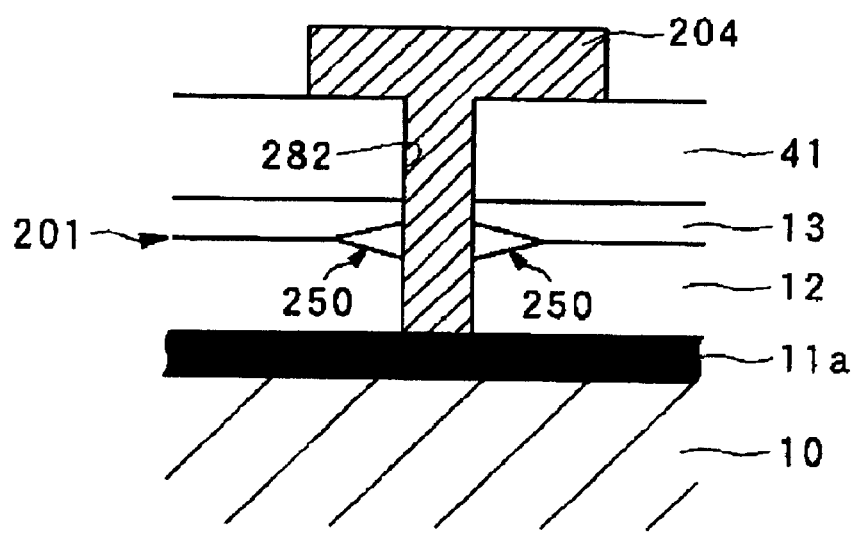

SUBSTRATE DEVICE MANUFACTURING METHOD AND SUBSTRATE DEVICE, ELECTROOPTICAL DEVICE MANUFACTURING METHOD AND ELECTROOPTICAL DEVICE AND ELECTRONIC UNIT

BACKGROUND OF THE INVENTION

1. Field of Invention

The present invention relates to a manufacturing method for a substrate device having a bonding interface on a substrate of an SOI (Silicon On Insulator) structure, as well as such a substrate device. The invention also relates to a manufacturing method for an electrooptical apparatus including a liquid-crystal device having a substrate device, as well as such an electrooptical device. The invention further relates to an electronic appliance having such an electrooptical device.

2. Description of Related Art

It is a general practice to manufacture an SOI-structured substrate device, which is one example of a substrate device having a bonding interface on a substrate thereof. An insulating film is formed on the surface of a main substrate, on one hand. On the other hand, an insulating film is formed on the surface of a semiconductor substrate that is separately prepared. Then, both substrates, in a state that they are closely contacted at the insulating films, are thermally processed to bond the insulating films together. Thereafter, the semiconductor substrate is separated so that a predetermined film thickness of a single-crystal semiconductor layer that is close to the bonding interface is left on the main substrate. This provides an SOI structure having these insulating films on the main substrate on which a single-crystal semiconductor layer is further formed. Thereafter, the thus formed single-crystal semiconductor layer is used to fabricate, thereon, semiconductor elements of thin film transistors (hereinafter "TFTs"), thin-film diodes (hereinafter "TFDs") and the like, thereby completing a substrate device.

With such a bonding technique, it is possible to form, on the substrate, high-performance semiconductor elements including a single-crystal semiconductor layer provided on a transparent substrate, e.g., a quartz glass substrate or a glass substrate, and to also form this structure on a semiconductor substrate.

SUMMARY OF THE INVENTION

However, in accordance with the above method, there is a tendency that the structure becomes complicated and that the thickness of the structure increases. For example, where an electrooptical device, such as a liquid-crystal device, is manufactured by using this type of substrate device, there is a need to form the layers of a light shielding film and interconnections at a position beneath the single-crystal semiconductor layer as well as above it. Particularly, there arises a necessity to electrically connect the light shielding film or interconnection and the other interconnection or element formed in the layers over the single-crystal semiconductor layer. In such a case, it is required to open a contact hole penetrating the interface between the insulating films. According to the research by the present inventor, where a contact hole penetrating such a bonding interface is opened simply by etching, an etch solution intrudes to the bonding interface. This may cause cracks or strip at a point in the contact hole passing the bonding interface, irregularly broadening in the bonding-interface gap in a direction along the substrate surface, poor electrical connection or insulation due to the contact hole, or poor electrical connection and insulation in the other interconnections and elements positioned close to the contact hole, for example.

As described above, the SOI or bonding technique per se that is generally used in the manufacturing method for a semiconductor device is advantageous. However, where this method is applied to a comparatively complicated overlying structure and particularly requiring a contact hole penetrating a bonding interface, as in the substrate device for an electrooptical device, such as a liquid-crystal device, defects, such as cracks and strip, may occur at the point in the contact hole passing the bonding interface. Thus, a serious malfunction in the device may be eventually incurred, which reduces the manufacturing yield.

The present invention addresses the foregoing problem, and provides a manufacturing method for a substrate device and such a substrate device capable, where manufacturing a substrate device requiring an open contact hole penetrating a bonding interface, of causing less defects at the point in the contact hole passing the bonding interface to finally enhance device reliability and thus manufacturing yield. The invention also provides a manufacturing method for an electrooptical device including the manufacturing method for a substrate device, such an electrooptical device, and an electronic appliance having such an electrooptical device.

A method for manufacturing a substrate device of the present invention that addresses the foregoing problem. The substrate device includes, on a substrate, a first conductive film, a first insulating film formed overlying the first conductive film, a second insulating film bonded on the first insulating film, a second conductive film overlying the second insulating film, and a contact hole opened in the first and second insulating films to connect the first conductive film and the second conductive film, and penetrate a bonding interface between the first insulating film and the second insulating film. The method includes a bonding step of bonding the first insulating film and the second insulating film together; an etching step of opening the contact hole penetrating the bonding interface by etching after the bonding step; a connecting step of electrically connecting between the first conductive film and the second conductive film through the contact hole. The etching process is made by dry etching that is started at least before an etchant reaches the bonding interface.

According to the method for manufacturing a substrate device of the invention, at first the first insulating film and the second insulating film are bonded together, for example, by a thermal process or the like in the bonding process. Thereafter, in the etching process, a contact hole is opened by etching that penetrates the bonding interface. On this occasion, dry etching is conducted at least before an etchant reaches the bonding interface. Thereafter, in the connection process, the first conductive film and the second conductive film are electrically connected through the contact hole. Consequently, electrical connection is provided, through the contact hole extending perpendicular to a substrate surface, between the interconnection, electrode, element or the like formed by the first conductive film and the interconnection, electrode, element or the like formed by the second conductive film, that are formed in the films sandwiching the bonding interface. Particularly, because the etching process to open a contact hole is made by dry etching that is high in directivity by the use of an etching gas at least before the etchant reaches the bonding interface, there is no possibility that the etch solution intrude to the bonding interface as encountered in wet etching. As a result, there is a reduced or almost no possibility that cracks or strip occur in a point of the contact hole passing the bonding interface or irregularly broadening in the gap at the bonding interface in a direction along the substrate surface. Accordingly, reliable electrical connection is available by the contact hole. Furthermore, reliable electrical connection or insulation is available in the other interconnection, element or the like that is positioned close to that contact hole.

As a result of the above, where the bonding technique is applied to the application requiring such a contact hole as having a comparatively complicated overlying structure and penetrating particularly a bonding interface, as in the substrate device for an electrooptical device, such as a liquid-crystal device, defects can be reduced at the point of the contact hole passing the bonding interface. This ultimately conspicuously enhances device reliability and manufacturing yield of the substrate device.

In one form of a method for manufacturing a substrate device of the invention, the substrate device further includes a semiconductor layer that is formed on the second insulating film and an interlayer insulating film that is formed on the semiconductor layer, the second conductive film being formed on the interlayer insulating film over the substrate. The method includes, before the bonding step, a step of forming the first conductive film on the substrate, a step of forming the first insulating film on the first conductive film, and a step of forming the second insulating film on the semiconductor layer included in a vicinity of a surface of a semiconductor substrate that is prepared separately from the substrate; and after the bonding step, a step of separating the semiconductor layer from the semiconductor substrate so that the second insulating film and the semiconductor layer are left on the first insulating film.

According to this form, prior to the bonding process, a first conductive film is formed on the substrate to form a first insulating film on the first conductive film, on one hand. On the other hand, a second insulating film is formed on a semiconductor layer included in the vicinity of the surface of the semiconductor substrate. After the bonding process, the semiconductor layer is separated from the semiconductor substrate so that the second insulating film and the semiconductor layer are left on the first insulating film. Accordingly, it is possible to manufacture, by the bonding technique, a substrate device having an interconnection, electrode, element or the like that is formed by a second conductive film overlying the semiconductor layer through an interlayer insulating film.

In accordance with a form of the invention, the semiconductor layer that is separated may be a single-crystal silicon layer.

This manufacturing method provides an SOI structure having a single-crystal silicon layer formed on a transparent substrate of a glass substrate, quartz substrate or the like, instead of a semiconductor substrate.

In accordance with a form of the invention, the step of separating the semiconductor layer further includes a step of fabricating a channel region, a source region and a drain region in the semiconductor layer to form a thin film transistor, and a step of forming the interlayer insulating film on the thin film transistor. The etching step opens the contact hole to penetrate through the interlayer insulating film, the second insulating film and the first insulating film.

With this manufacturing method, high-performance thin film transistors can be formed having, as a semiconductor layer, a single-crystal silicon layer on the SOI substrate.

Moreover, a reliable substrate device can be manufactured having electrical connection through the contact hole between the second conductive film of interconnection, electrode, element or the like positioned above the thin film transistor and the first conductive film of interconnection, electrode, element or the like positioned below the thin film transistor.

In this case, the step of forming the first conductive film may include forming the first conductive film by a conductive light shielding film in a region of the semiconductor layer opposed at least to the channel region on the substrate.

With this manufacturing method, in the case of using a transparent substrate as a substrate, a substrate device can be manufactured which can favorably perform light shielding of the incident light on the channel region of the thin film transistor from the side of substrate by shielding the first conductive film during the manufacture of the device. Consequently, the characteristic of the thin film transistor can be further enhanced by reducing or preventing light-leak current due to a photoelectric effect in the channel region during operation. Incidentally, such a shielding conductive film may be formed by a single metal, an alloy, a metal silicide, a polycide or a lamination thereof, including at least one of refractory metals, e.g., Ti (titanium), Cr (chromium), W (tungsten), Ta (tantalum) and Mo (molybdenum).

The foregoing form, including a step of forming a thin film transistor may further include, on the substrate, a step of of forming a source electrode connected to the source region by reducing a resistance of a silicon film due to ion implantation, and a step of of forming a drain electrode connected to the drain region by reducing a resistance of a silicon film due to ion implantation.

With this manufacturing method, the source or drain electrode formed by a silicon film reduced in resistance by ion implantation can be favorably connected to a source or drain region formed, e.g., by a single-crystal silicon or polysilicon film. In this case, particularly where the source or drain region is a $P^+$ type, the formation of a $P^+$-type source or drain electrode by ion implantation does not require the architecture of a PN junction in the junction surface of the both, thus realizing favorable electrical connection.

In this case, the source electrode and the drain electrode may be formed by the same layer as the second conductive film.

With this manufacturing method, using the same layer as the second conductive film, the overlying structure and the manufacture process are simplified on the substrate.

Another form of a method for manufacturing a substrate device of the invention further includes a step of performing a CMP (Chemical Mechanical Polishing) process on the first insulating film prior to the bonding step.

According to this form, because the bonding process is performed after planarizing the first insulating film by a CMP process, the gap can be decreased at the bonding interface between the first insulating film and the second insulating film. Incidentally, the second insulating film, if formed by thermal oxidation on the semiconductor substrate, can obtain sufficient flatness. This also can be CMP-processed.

In another form of a method for manufacturing a substrate device of the invention, in the bonding step, the first insulating film and the second insulating film are bonded together in a close contact state by a thermal process.

With this form, bonding is comparatively easy to perform by a thermal process, e.g., at approximately 600° C.

In another form of a method for manufacturing a substrate device of the invention, the etching process is performed without using wet etching.

With this form, because a contact hole is opened, extending from the second conductive film to the first conductive film, by only dry etching without using wet etching, the etching process is performed comparatively simply.

In another form of a method for manufacturing a substrate device of the invention, the etching step is performed by wet etching at least temporarily until an etchant reaches the bonding interface, followed by dry etching.

In accordance with this form, in the etching process, wet etching is performed at least temporarily until the etchant reaches the bonding interface. Namely, wet etching is performed using an etch solution down to a predetermined depth shallower than the bonding interface, by etching-time control or the like. Thereafter, dry etching is performed to continue etching penetrating the bonding interface to the first conductive film. Accordingly, the etch solution will not intrude to the bonding interface.

In another form of a method for manufacturing a substrate device of the invention, in the connecting step, a part of the second conductive film is formed at an inside of the contact hole.

In accordance ith this form, after opening a contact hole, where forming a second conductive film, e.g., by sputtering, CVD or the like, a part of second conductive film is also formed in the contact hole. This comparatively easily provides a structure having the integral connection between the interconnection, electrode, element or the like formed by a second conductive film having a predetermined pattern and a portion of the second conductive film at the inside of the contact hole.

In another form of a method for manufacturing a substrate device of the invention, in the connecting step, a conductive plug is formed at an inside of the contact hole.

In accordance with this form, after opening a contact hole, a conductive plug, e.g., of a refractory metal, is formed in the contact hole. Even if the contact hole has a great depth or small in diameter, electrical connection that is comparatively high in reliability is obtained through the contact hole.

A substrate device of the invention that address the foregoing problem includes: on a substrate, a first conductive film; a first insulating film formed overlying the first conductive film; a second insulating film bonded on the first insulating film; a second conductive film overlying the second insulating film; and a contact hole opened in the first and second insulating films to connect the first conductive film and the conductive film, and penetrate a bonding interface between the first insulating film and the second insulating film. A point in the contact hole penetrating the bonding interface is not eroded by an etch solution.

According to the substrate device of the invention, electrical connection is provided, through the contact hole extending perpendicular to the substrate surface, between the interconnection, electrode, element or the like formed by the first conductive film and the interconnection, electrode, element or the like formed by the second conductive film, that are formed in the films sandwiching the bonding interface. Particularly, the point in the contact hole penetrating the bonding interface will not be eroded by an etch solution. Accordingly, this point is almost free of cracks or strip resulting from the etch solution. Reliable electric connection is available by the contact hole. Furthermore, reliable electrical connection or insulation is also available in the other interconnection, element or the like positioned close to that contact hole.

The above ultimately results in enhanced device reliability.

A substrate device in one form of the invention further includes a semiconductor layer on the second insulating film and an interlayer insulating film on the semiconductor layer, the second film being formed on the interlayer insulating film over the substrate, a channel region, a source region and a drain region being fabricated in the semiconductor layer to architect a thin film transistor, the contact hole being opened so as to penetrate through the interlayer insulating film, the second insulating film and the first insulating film.

In accordance ith this form, the thin film transistor is enhanced in performance by providing a single-crystal silicon layer as a semiconductor layer over the SOI substrate. Moreover, electrical connection is provided, through a contact hole almost free of defects, between the interconnection, electrode, element or the like formed by the second conductive film positioned above the thin film transistor and the interconnection, electrode, element or the like formed by the first conductive film positioned below the thin film transistor. Thus, entire device reliability is high.

In accordance with this form, the first conductive film is formed by a light shielding conductive film in a region of the semiconductor layer that is opposed to the channel region on the substrate.

In accordance with this structure, in the case of using a transparent substrate as a substrate, it is possible to favorably shield against the light incident on the channel region of the thin film transistor from the side of the substrate by the light shielding first conductive film. Due to this, the characteristic of the thin film transistor can be further enhanced by reducing or preventing the occurrence of light-leak current in the channel region due to a photoelectric effect.

In this case, it is advantageous to connect the first conductive film to a fixed-potential interconnection formed by the second conductive film through the contact hole, because the potential variation on the first conductive film having the light shielding property has no negative effect upon the thin film transistor.

Another form of a substrate device of the invention further includes, on the substrate, a pixel electrode, an intermediate conductive film interlevel-connecting the pixel electrode and one of the source region and the drain region. The substrate device also includes a pixel-potential capacitance electrode, and a capacitance line including a fixed-potential capacitance electrode arranged opposite to the pixel-potential capacitance electrode through a dielectric film. A storage capacitance is architected and connected from the pixel-potential capacitance electrode and the fixed-potential capacitance electrode to the pixel electrode.

In accordance with this form, the pixel electrode and one of the source and drain regions are interlevel-connected by an intermediate conductive film. Consequently, even where the interlayer distance is long between both structures, both structures can be favorably electrically connected together while avoiding the technical difficulty in connecting them through a long-distance contact hole or the like. Furthermore, the intermediate conductive film providing for such interlevel-connection also serves as a pixel-potential capacitance electrode of a storage capacitance. Accordingly, it is possible to simplify the overlying structure and manufacturing process as compared to the case of separately forming an interlevel-connecting conductive film and a pixel-potential capacitance electrode conductive film.

In this form, one of the intermediate conductive film and the capacitance line may be the same film as the second conductive film.

In accordance with this structure, using the same film as the second conductive film, the overlying structure and manufacturing process on the substrate can be simplified.

In the form architected with the storage capacitance, at least one of the intermediate conductive film and the capacitance line may be formed by a conductive light shielding film and include a portion covering the channel region at above thereof on the substrate.

In accordance with this structure, because the channel region is covered from above by at least one of the intermediate conductive film formed by a conductive light shielding film and the capacitance line, the channel region can be shielded against the incident light from above. Consequently, it is possible to effectively reduce or prevent, in the channel region, the occurrence of light-leak current due to a photoelectric effect resulting from incident light. Moreover, the overlying structure and manufacturing process can be simplified as compared to the case of separately forming such a light shielding film.

Incidentally, such a conductive light shielding film may be formed of a single metal, an alloy, a metal silicide, a polyside or a lamination thereof, including at least one of refractory metals, e.g., Ti, Cr, W, Ta and Mo. Otherwise, it may be formed of another metal, such as Al (aluminum).

The form architected with the storage capacitance further includes, on the substrate, a scanning line connected to a gate electrode formed on the channel region through a gate insulating film, a data line connected to the other of the source region and the drain region, and another intermediate conductive film interlevel-connecting between the data line and the other of the source region and the drain region and formed by the same film as the second conductive film.

In accordance with this structure, the data line and the other of the source and drain regions are interlevel-connected together by another intermediate conductive film. Consequently, even if the interlayer distance between both structures is long, favorable electrical connection is provided between the both while reducing or avoiding the technical difficulty in connecting both structures by a long-distance contact hole or the like. Furthermore, the overlying structure and manufacturing process on the substrate can be simplified by using, as the other intermediate conductive film, the same film as the second conductive film.

In this case, the storage capacitance may be partly provided at least in a region overlapped with the scanning line as viewed in a plan view.

In accordance with this structure, because a storage capacitance can be fabricated in a region overlapped with the scanning line, storage capacitance can be increased without narrowing the opening area in each pixel.

In this case, the storage capacitance may be partly provided at least in a region that is overlapped with the data line as viewed in a plan view.

In accordance with this structure, because a storage capacitance can be fabricated in a region that is overlapped with the data line, storage capacitance can be increased without narrowing the opening area in each pixel.

A method for manufacturing an electrooptical device of the invention that address the foregoing problem and that includes various of the above forms can also include: a step of bonding together the substrate device with a counter electrode in a oppositely arranged state, and a step of filling an electrooptical substance between the substrate device and the counter substrate.

This method can enhance the device reliability and manufacturing yield in an electrooptical device, such as a liquid-crystal device, utilizing the bonding or SOI technique.

An electrooptical device of the invention that address the foregoing problem and that includes various of the above forms can also include a counter substrate arranged opposite to the substrate device; and an electrooptical substance sandwiched between the counter substrate and the substrate device.

This electrooptical device of the invention can enhance device reliability.

An electrooptical device in one form of the invention includes a first interconnection or electrode formed by the first conductive film, and a second interconnection or electrode formed by the second conductive film, in a peripheral region positioned in a periphery of an image display region on the substrate arranged with the electrooptical substance, the contact hole connecting between the first interconnection or electrode and the second interconnection or electrode in the peripheral region.

In accordance with this structure, various interconnections, electrodes or thin film transistors can be structured by using the first and second conductive films in the image display region, while the first interconnection or electrode of the first conductive film and the second interconnection or electrode of the second conductive film are favorably connected together by using a contact hole in the peripheral region.

An electrooptical device in another form of the invention further includes a peripheral circuit fabricated in a peripheral region positioned in a periphery of an image display region on the substrate arranged with the electrooptical substance, the peripheral circuit including the first conductive film, the second conductive film and the contact hole.

In accordance with this form, various interconnections, electrodes or thin film transistors can be structured by using the first and second conductive films in the image display region while peripheral circuits can be structured by using the first and second conductive films and contact holes in the peripheral region.

An electronic appliance of the invention that is structured by having the foregoing electrooptical device of the invention can provide a reliable electronic appliance in various kinds, e.g., a projector, a display device incorporated in OA device equipment and a display device in cellular phone.

The operation and other advantages of the invention will be made apparent from the embodiments to be explained in the following.

BRIEF DESCRIPTION OF THE DRAWINGS

FIG. 3 includes sectional views of processes in a manufacturing method for a substrate device in the embodiment;

FIGS. 4(a) and 4(b) are enlarged sectional views, wherein FIG. 4(a) shows a contact hole region of the substrate device in the embodiment, and FIG. 4(b) shows a contact hole region of a substrate device in a comparative example;

DETAILED DESCRIPTION OF PREFERRED EMBODIMENTS

Explanations are provided below with regard to embodiments of the present invention with reference to the drawings.

(Substrate Device)

Figure 1:
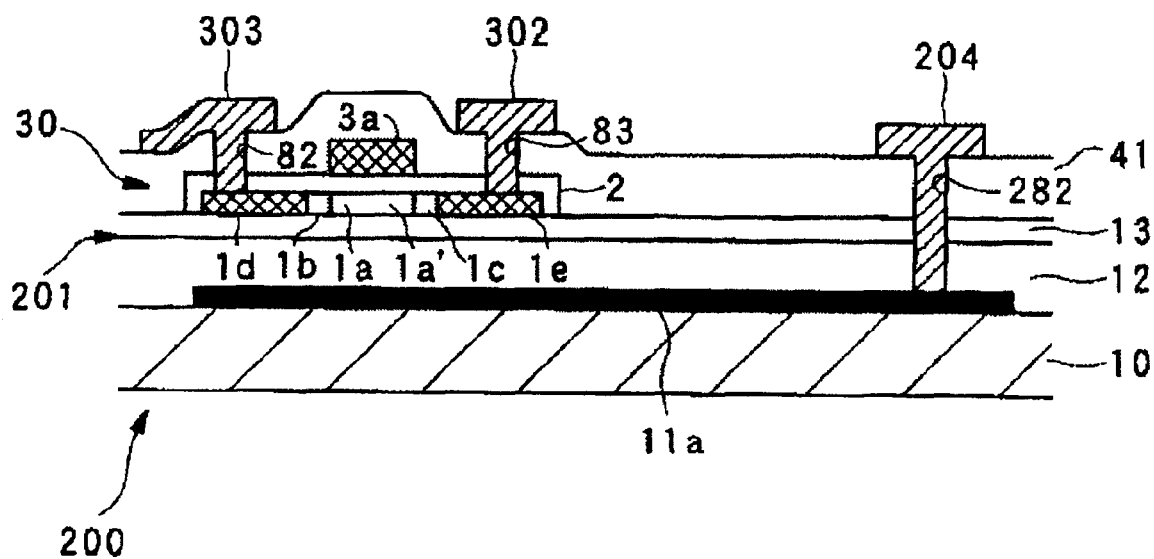
FIG. 1 is a sectional view of a substrate device in an embodiment of the invention.

FIG. 1 is a sectional view of a substrate device that is an embodiment of the present invention. The substrate device of this embodiment constitutes a TFT array substrate of a pair of substrates, e.g., structuring an electrooptical device as discussed below. However, the application is not limited to this form.

In FIG. 1, a substrate device 200 is structured, on a substrate 10, with a lower light shielding film 11a as an example of a first conductive film, a first underlying insulating film 12 as an example of a first insulating film, a second underlying insulating film 13 as an example of a second insulating film, a semiconductor layer 1a of a single-crystal silicon layer forming a pixel-switching or peripheral-circuit TFT 30, such an electrooptical device as discussed below, a scanning line 3a including a gate electrode forming the TFT 30, an insulating film 2 including a gate insulating film forming the TFT 30, a first interlayer insulating film 41, a source electrode 303, and drain electrode 302 formed by the same conductive film, and an extension electrode 204 forming one example of a second conductive film, in this order.

The substrate 10, formed by a glass substrate, a quartz substrate, a silicon substrate or the like, is a transparent substrate where the substrate device is a light-transmission type, or an opaque substrate where the substrate device is a light-reflection type.

The lower light shielding film 11a is formed by a single metal, an alloy, a metal silicide, a polycide or a lamination thereof, including at least one of refractory metals, e.g., Ti, Cr, W, Ta and Mo. The lower light shielding film 11a covers at least a channel region 1a', at an under side thereof in FIG. 1, of a semiconductor layer 1a forming the TFT 30, thereby shielding the optical feedback traveling toward the TFT 30 from an under side in FIG. 1.

The first underlying insulating film 12, formed over the entire surface of the substrate 10, serves to reduce or prevent roughening in the surface of the substrate 10 during polishing or deterioration in the TFT 30 characteristic due to the dirt or the like left after washing.

A second underlying insulating film 13 is bonded on the first underlying insulating film 12 at its bonding interface 201 thereof.

The TFT 30, having an LDD (Lightly Doped Drain) structure, is structured with a gate electrode formed by a part of the scanning line 3a, a channel region 1a' of the semiconductor layer 1a to form therein a channel under an electric field from the scanning line 3a, an insulating film 2 including a gate insulating film for insulation between the scanning line 3a and the semiconductor layer 1a, a low-concentration source region 1b and a low-concentration drain region 1c of the semiconductor layer 1a, a high-concentration source region 1d and a high-concentration drain region 1e of the semiconductor layer 1a, a source electrode 303 and a drain electrode 302.

On the scanning line 3a, a first interlayer insulating film 41 is formed to form therein a contact hole 82 communicating between the high-concentration source region 1d and the source electrode 303, a contact hole 83 communicating between the high-concentration drain region 1e and the drain electrode 302, and a contact hole 282 communicating between the lower shadow film 11a and the extension electrode 204.

(Manufacturing Method for Substrate Device)

Figure 2:
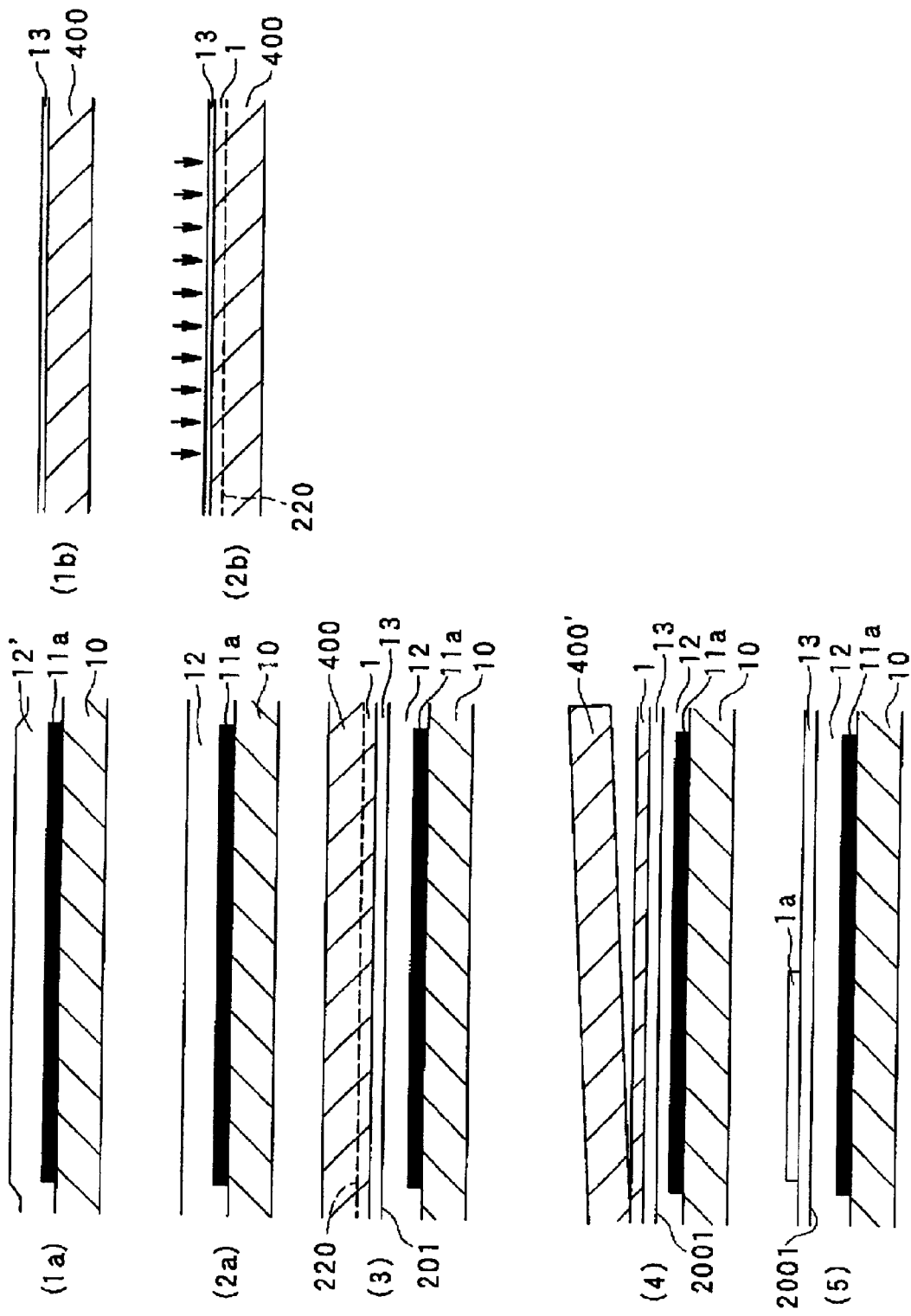
FIG. 2 includes sectional views of processes in a manufacturing method for a substrate device in an embodiment.
Figure 5:
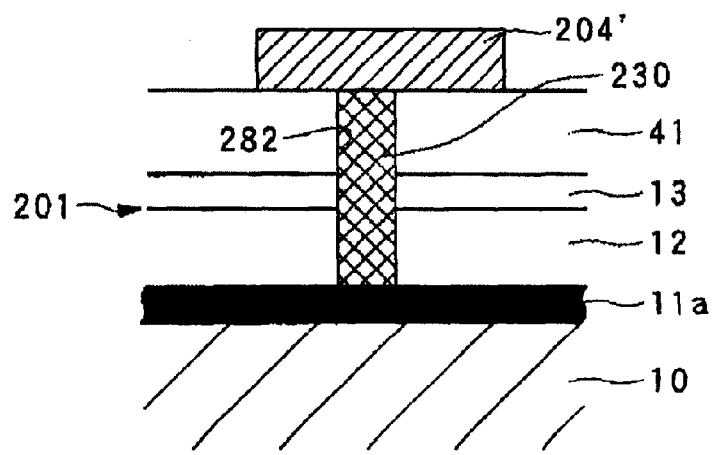
FIG. 5 is an enlarged sectional view of a contact hole region of a substrate device in a modification.

Next, an explanation is provided of a manufacturing method for a substrate device having the above structure, with reference to FIGS. 2 to 5. Herein, FIGS. 2 and 3 show processes, in order, with regard to the sectional structures shown in FIG. 1. FIG. 4(a) is an enlarged sectional view showing a connection point of between the lower shadow film 11a and the extension electrode 204. FIG. 4(b) is an enlarged sectional view on the same point in a comparative example, while FIG. 5 is an enlarged sectional view on the same point in a modification.

In a process step (1a) of FIG. 2, a substrate 10 is first prepared, such as a quartz substrate, a hard glass or a silicon substrate. Herein, an annealing process is preferably performed on the surface in an inert gas atmosphere of $N_2$ (nitrogen) or the like at a high temperature of approximately 900–1300° C., thereby providing a pre-treatment in order to reduce the strain on the substrate 10 to be caused in the later high-temperature process.

Subsequently, sputtering is performed over the entire surface 10 of the processed substrate by using a metal alloy of the metals, such as Ti, Cr, W, Ta or Mo, a metal silicide or the like, to thereby form a light shielding film having a film thickness of approximately 100–500 nm, preferably approximately 200 nm. Then, a lower light shielding film 11a in a predetermined surface shape is formed by photolithography and etching.

Subsequently, on the lower shadow film 11a, a first underlying insulating film 12' of a silicate glass film, silicon nitride film, silicon oxide film or the like, such as NSG, PSG, BSG or BPSG, is formed using a TEOS (Tetra Ethyl Ortho Silicate) gas, TEB (Tetra Ethyl Borate) gas or TMOP (Tetra Methyl Oxy Phoslate) gas by an atmospheric or low-pressure CVD process or the like.

Next, in the process step (2a), a CMP process is performed on the first underlying insulating film 12' to planarize the surface thereof. Specifically, for example, while pouring a liquid slurry (chemical abrasive liquid) containing silica particles onto a polish pad fixed onto a polish plate, it is brought into contact with a surface (the surface close to the first underlying insulating film 12') of the substrate fixed on a spindle thereby polishing the surface of the first underlying insulating film 12'. This polishing process is terminated by time control or by a proper stopper layer formed at a predetermined position on the substrate 10. As a result, a first underlying insulating film 12 is completed having a film thickness of 500–1500 nm and planarized at an upper surface thereof.

On the other hand, separately from the process steps (1*a*) and (2*a*), a semiconductor substrate 400 is prepared in a process step (1*b*). Specifically, in the case of making a TFT 30 in a P-channel type, an N-type semiconductor substrate 400 is prepared. Where making a TFT 30 in an N-channel type, a P-type semiconductor substrate 400 is prepared. Note that the doping using a V-group or III-group element may be performed in the stage of ingot, or may be in the stage of wafer or, furthermore, after the transfer of a semiconductor layer 1 onto the substrate 10.

Subsequently, a thermal process is performed on the semiconductor substrate 400 at a high temperature, e.g., of approximately 900–1300° C., to form a second underlying insulating film 13 as a thermal oxide film on the surface thereof.

Next, in a process step (2*b*), hydrogen ions are implanted in the second underlying insulating film 13 thus formed on the semiconductor substrate 400. Although the amount of hydrogen ions implanted makes it possible to control a layer thickness of a semiconductor layer 1 at which separation is to be made at a separation line 220 in the later separation process, a specific amount of implantation is individually set experimentally, empirically or by simulation.

Next, in the process step (3), the semiconductor substrate 400 shown in process step (2*b*) is vertically inverted into an opposed arrangement of the both substrates so that the second underlying insulating film 13 formed in the process step (2*b*) at its surface comes into close contact with the surface of the first underlying insulating film 12 formed in the process step (2*a*). By conducting a thermal process, e.g., at approximately 600° C. in this state, the first underlying insulating film 12 and the second underlying insulating film 13 are bonded together and mutually adhered at an interface 201.

Next, in process step (4), the both substrates are separated. Herein, the semiconductor layer 1 having a layer thickness depending upon the amount of hydrogen ion implanted in the process step (2*b*) is separated, together with the second underlying insulating film 13 as a thermal oxidation film thereof, from the semiconductor substrate 400 at a separation line 220. Furthermore, a surface treatment by touch polishing is made to the semiconductor layer 1*a* transferred onto the substrate 10. These processes form a semiconductor layer 1 having a layer thickness, e.g., of approximately 50–200 nm. The semiconductor substrate 400' from which the semiconductor layer 1 is separated will be recycled.

Next, in process step (5), photolithography and etching are performed on the first semiconductor layer 1, on the second underlying insulating film 13 bonded at the bonding interface 201 on the first underlying insulating film 12, to form a semiconductor layer 1*a* having a predetermined pattern. A semiconductor layer 1*a* is formed having an SOI structure.

Next, in process step (6) of FIG. 3, the semiconductor layer 1*a* is thermally oxidized at a temperature of approximately 900–1300° C., preferably at a temperature of approximately 1000° C., to form a lower-layer gate insulating film. By subsequently performing a low-pressure CVD process or the both processes, an upper-layer gate insulating film is formed. In this way, a multi-layered insulating film 2 (including a gate insulating film) is formed including a high-temperature-oxidized silicon film (HTO film) and a silicon nitride film. As a result, the semiconductor layer 1*a* will have a thickness of approximately 30–150 nm, preferably a thickness of approximately 35–50 nm, while the insulating film 2 will have a thickness of approximately 20–150 nm, preferably a thickness of approximately 30–100 nm.

Subsequently, in order to control a threshold voltage Vth of TFT 30, a dopant, such as boron, is doped in a preset predetermined amount by ion implantation or the like in an N-channel or P-channel region of the semiconductor layer 1*a*.

Subsequently, a polysilicon film is deposited by a low-pressure CVD process or the like. Furthermore, phosphorus (P) is thermally diffused to make the polysilicon film conductive. Alternatively, a doped polysilicon film may be used that is introduced with P ions simultaneously with depositing the polysilicon film. The film thickness of the polysilicon film is approximately 100–500 nm, preferably approximately 350 nm. By photolithography and etching, a predetermined pattern of scanning line 3*a* is then formed including a gate electrode region of a TFT 30.

For example, in the case of making a TFT 30 in an n-channel TFT having an LDD structure, in order to form a low-concentration source region 1*b* and low-concentration drain region 1*c*, the semiconductor layer 1*a* is doped with a dopant of a group-V element, such as P at low concentration (e.g., P ions at a dose of $1–3\times10^{13}/cm^2$) using the scanning line 3*a* (gate electrode) as a mask. This makes the semiconductor layer 1*a* at a position beneath the scanning line 3*a* into a channel region 1*a*'. Furthermore, in order to form a high-concentration source region 1*d* and a high-concentration drain region 1*e* structuring a pixel-switching TFT 30, a resist layer having a plan pattern that is greater in width than the scanning line 3*a* is formed on the scanning line 3*a*. Thereafter, a dopant of a group-V element, such as P, is doped at high concentration (e.g., P ions at a dose of $1–3\times10^{15}/cm^2$). Note that an offset-structured TFT may be made without performing low-concentration doping, or a self-aligned TFT may be made using the scanning line 3*a* as a mask by an ion-implant technique using P ions, B ions or the like. By the doping of such an impurity, the scanning line 3*a* is further reduced in resistance.

Subsequently, using a TEOS gas, TEB gas, TMOP gas or the like, a first interlayer insulating film 41 including a silicate glass film, a silicon nitride film, silicon oxide film or the like, such as NSG, PSG, BSG or BPSG, is formed on the scanning line 3*a*, e.g., by an atmospheric or low-pressure CVD process. The film thickness of the first interlayer insulating film 12 is, e.g., approximately 500–2000 nm. Herein, an annealing process is preferably performed at a high temperature of approximately 800° C., thereby enhancing the film quality in the interlayer insulating film 41.

Next, in process step (7), dry etching, i.e., reactive ion etching, reactive ion beam etching or the like, is made on the first interlayer insulating film 41 to simultaneously open contact holes 82, 83 and 282.

Subsequently, a polysilicon film is deposited by a low-pressure CVD process or the like. Furthermore, phosphorus (P) is thermally diffused to make the polysilicon film conductive. Alternatively, a doped polysilicon film may be used that is introduced with P ions simultaneously with depositing the polysilicon film. The film thickness of the polysilicon film is approximately 100–500 nm, preferably approximately 150 nm. Then, by photolithography and etching, a source electrode 303, a drain electrode 302 and an extension electrode 204 are formed, as shown in FIG. 1. This embodiment particularly makes it possible to electrically connect the extension electrode 204 and the lower shadow film 11*a*, that are formed in the layers sandwiching the bonding interface 201, through the contact hole 82 extending vertically to the surface of the substrate.

The foregoing electrooptical device of the first embodiment can be manufactured by the manufacturing process explained above.

In this embodiment, particularly, the contact hole 282 is opened through the bonding interface 201 by dry etching in the process step (7) of FIG. 3. Namely, the etching process is started before the etchant reaches at least the bonding interface 201. Accordingly, there is no possibility for etch solution to penetrate to the bonding interface 201, as is encountered in wet etching.

As a result, as shown in FIG. 4(a) with enlargement, there is almost no possibility that crack or strip occur in the contact hole 282 at a position passing through the bonding interface 201, or a gap at the bonding interface 201 to irregularly broaden along the surface of the substrate.

On the contrary, in the case of FIG. 4(b) showing a comparative example having a contact hole 282 opened by wet etching, crack 250 occurs in the contact hole 282 at a position passing through the bonding interface 201.

In this manner, this embodiment makes it possible to provide a reliable electrical connection with the contact hole 282. Furthermore, reliable electrical connection or insulation is made possible in the other interconnections, elements and the like positioned close to the contact hole 282.

As a result of the above process, by applying the substrate device 200 of the embodiment to such an application, requiring a substrate device having a comparatively complicated overlying structure, while utilizing bonding and SOI techniques, in particular, in an electrooptical device, such as a liquid-crystal device discussed below, defects can be reduced in the contact hole 282 at its position passing the bonding interface 201. It is therefore possible to ultimately substantially enhance the device reliability and manufacturing yield of the entire electrooptical device.

In the process step (7) of FIGS. 4(a) and 4(b), dry etching was exclusively used in opening the contact hole 282. However, wet etching may be performed using an etching solution down to a predetermined depth shallower than the bonding interface 201 through etching-time control or the like. Thereafter, by performing dry etching to penetrate the bonding interface 201 and continuing the etching down to the lower shadow film 11a, etching solution will not penetrate to the bonding interface 201.

Meanwhile, although in the embodiment the conductive film is formed to also form the extension electrode 204 in the contact hole 282, it is also possible, as in the modification shown in FIG. 5, to form a conductive plug 230 of refractory metal, e.g., Cr or Mo, in the contact hole 282 after opening the contact hole 282 and then form an extension electrode 204'.

Next, an explanation is provided of an embodiment of an electrooptical device of the invention having an electrooptical substrate device structured as above, in conjunction with the drawings. The embodiment discussed below is one in which an electrooptical device of the invention is applied to a liquid crystal device.

(Electrooptical Device Overall Structure)

Figure 6:
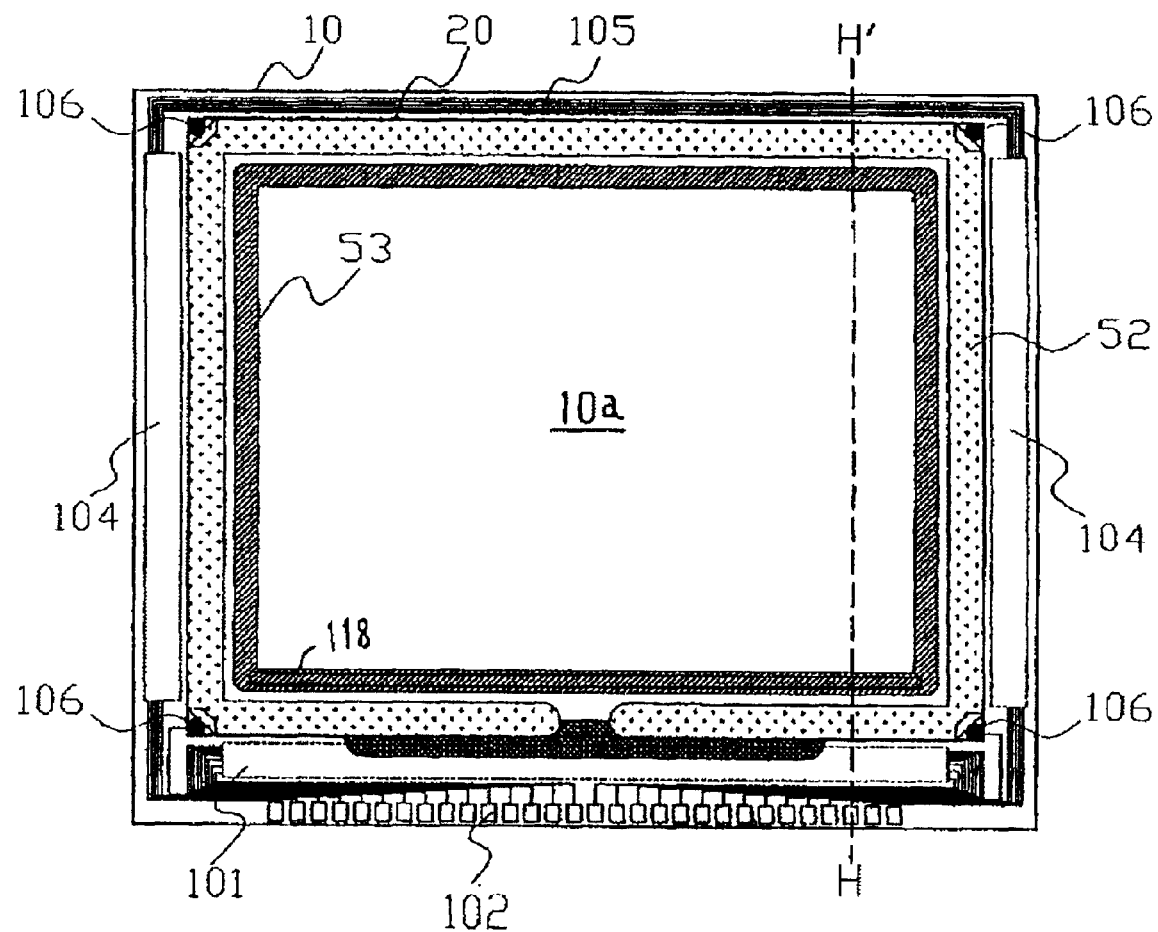
FIG. 6 is a plan view of a TFT array substrate of an electrooptical device in an embodiment of the invention, together with the constituent elements formed thereon, as viewed from the side of a counter substrate.
Figure 7:
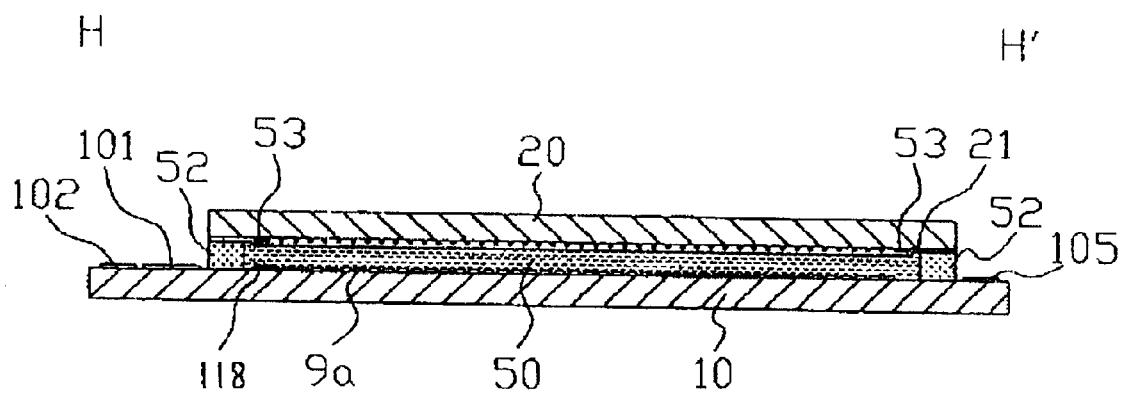
FIG. 7 is a sectional view taken along plane H–H' in FIG. 6.

First, explanation is provided of the overall structure of an electrooptical device in an embodiment of the invention, with reference to FIGS. 6 and 7. Herein, a discussion is provided of a TFT active matrix addressed liquid crystal device with its own built-in driver circuit as an example of an electrooptical device. FIG. 6 is a plan view of a TFT array substrate together with the constituent elements formed thereon as viewed from a side of the counter substrate. FIG. 7 is a sectional view taken along plane H–H' in FIG. 6.

In FIGS. 6 and 7, the electrooptical device according to the embodiment is arranged so that a substrate 10 forming a substrate device shown in FIG. 1 faces an opposing substrate 20.

A liquid crystal 50 is filled between the substrate 10 and the opposing substrate 20. The substrate 10 and the opposing substrate 20 are bonded together by a seal member 52 provided in a seal region positioned in the periphery of an image display region 10a. The seal member 52 is formed, for example, of thermoset resin, thermo-and-optical set resin, optical set resin or UV-set resin, in order to bond the both substrates together. In the manufacturing process, the resin is applied on the substrate 10 and then cured by heating, heating and light radiation, light radiation or UV-ray radiation.

The seal member 52 is mixed with a gap material of glass fiber, glass beads or the like, in order to provide a spacing between the substrates (gap between the substrates) to a predetermined value. Namely, the electrooptical device of the embodiment is small in size as a projector light valve, and suited for display with magnification. In cases where the electrooptical device is a large-sized liquid crystal device, such as the liquid crystal display or liquid crystal television for display without magnification, such a gap material may be contained in the liquid crystal layer 50.

Vertical conductor members 106 are respectively provided at four corners on the opposiong substrate 20. Electrical conduction is provided between the vertical conductor terminals provided on the substrate 10 and the opposing electrode 21 provided on the counter substrate 20.

In FIGS. 6 and 7, a light shielding frame 53 that defines an image display region 10a is provided on the counter substrate 20 at a position parallel with the inside of a seal region having the seal member 52. The frame 53 may be provided on the substrate 10. A data-line drive circuit 101 and external-circuit connecting terminals 102 are provided along one side on the substrate 10, in an outer area of the seal region arranging the seal member 52 of the peripheral region extending in the periphery of the image display region. Scanning-line drive circuits 104 are provided along the two sides adjacent to that side. Furthermore, a plurality of interconnections 105 are provided along the remaining one side on the substrate 10, in order to connect between the scanning-line drive circuits 104 provided on the both sides of the image display region 10a.

In FIG. 7, on the substrate 10, an alignment film is formed over the pixel electrodes 9a after forming pixel-switching TFTs, and interconnections of scanning and data lines. On the other hand, on the opposing substrate 20, an alignment film is formed in the uppermost layer besides the opposing electrode 21. Meanwhile, the liquid crystal layer 50 is formed of a liquid crystal mixed, for example, with one or a plurality of nematic liquid crystals, to assume a predetermined orientation state between the pair of orientation films.

In the embodiment, a sampling circuit 118 is provided in a region beneath the frame 53 on the substrate 10. The sampling circuit 118 is configured to sample image signals on an image signal line according to a sampling-circuit drive signal supplied from the data-line drive circuit 101 so as to supply it onto the data line.

(Electrooptical Device Circuit Configuration and Operation)

Figure 8:
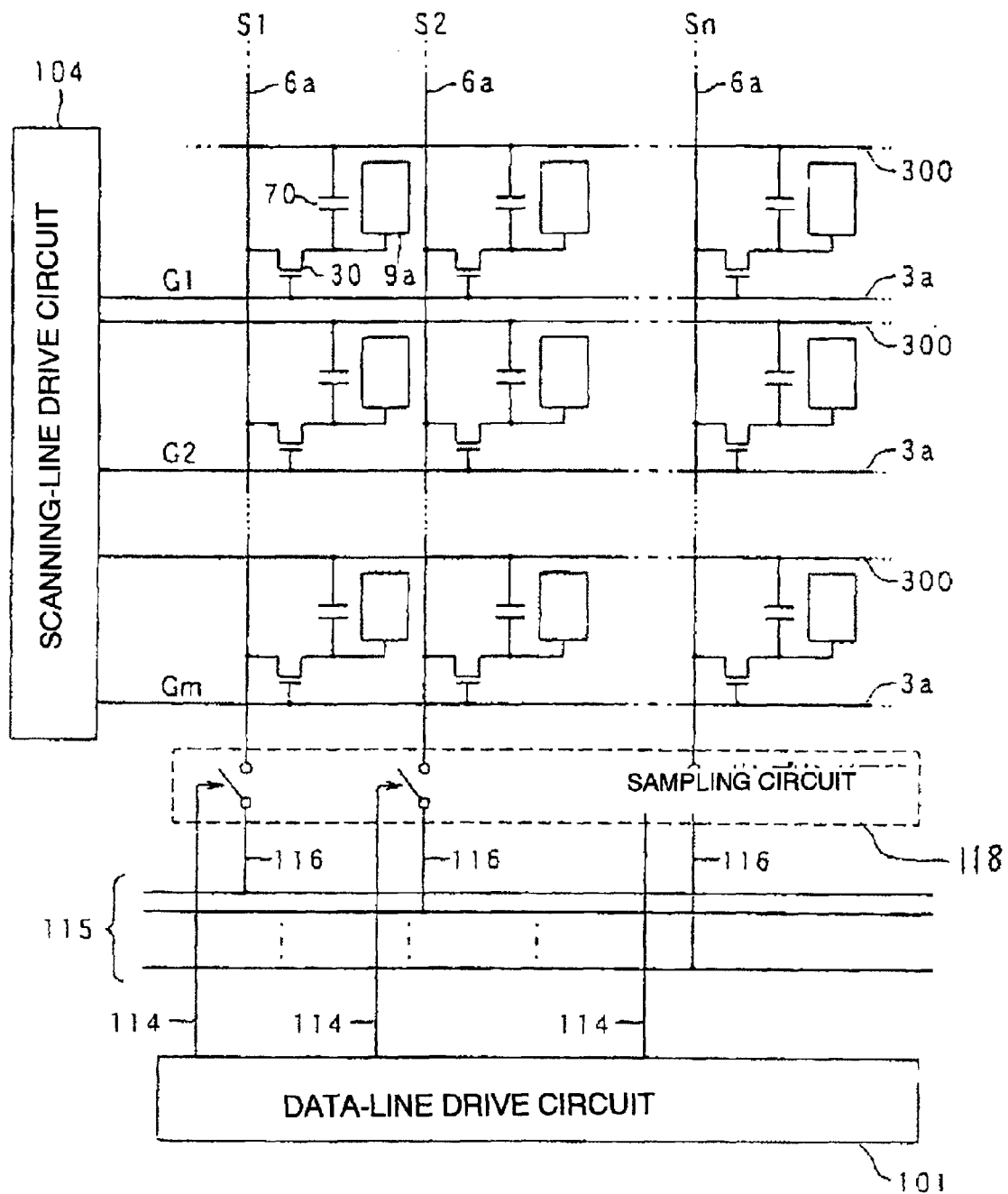
FIG. 8 is a schematic of an equivalent circuit including various elements, interconnections and the like provided on a plurality of pixels configuring an image display region of the electrooptical device in the embodiment of the invention.

Next, an explanation is provided regarding a circuit configuration and operation of the electrooptical device structured as above with reference to FIG. 8. FIG. 8 is a schematic showing equivalent and peripheral circuits of various elements, interconnections, etc. at a plurality of pixels formed in a matrix form constituting the image display region of the electrooptical deivce.

In FIG. 8, the electrooptical device of the embodiment has a plurality of pixels formed in a matrix form to constitute an image display region. Each pixel is formed with a pixel electrode 9a and a TFT 30 to switch the pixel electrode 9a. The data lines 6a, that supply an image signal, are electrically connected to the source electrodes of the TFTs 30.

In the peripheral region outside of the pixel display region 10a, the data line 6a at one end (lower end in FIG. 6) is connected to the drain of each switching element, e.g., of a TFT, of the sampling circuit 118. On the other hand, the image signal line 115 is connected to the source of the TFT of the sampling circuit 118 through an extension line 116. The sampling-circuit drive signal line 114, connected to the data-line drive circuit 101, is connected to the gate of the TFT of the sampling circuit 118. The image signal S1, S2, . . . , Sn on the image signal line 115 is sampled and supplied to the data line 6a by the sampling circuit 118 according to a sampling-circuit drive signal supplied from the data-line drive circuit 101 through the sampling-circuit drive signal line 114.

The image signals S1, S2, . . . Sn, to be written to the data lines 6a, may be supplied line-sequentially or supplied to the adjacent data lines 6a based on a group thereof.

Meanwhile, the scanning line 3a is electrically connected to the gate of the pixel-switching TFT 30 so that scanning signal G1, G2, . . . Gm is pulsatively applied line-sequentially in predetermined timing to the scanning lines 3a by the scanning-line drive circuit 104. The pixel electrode 9a is electrically connected to the drain of the TFT 30. By switching off the TFT 30 as a switching element for a predetermined period, an image signal S1, S2, . . . , Sn supplied from the data line 6a is written in predetermined timing. The image signal S1, S2, . . . , Sn in a predetermined level, written to the liquid crystal as an example of an electrooptic substance via the pixel electrode 9a, is held for a certain period between the pixel electrode and the opposing electrode 21 formed on the opposing substrate. The liquid crystal is changed in orientation or order in set of molecules according to a potential level applied, thereby enabling light modulation and grayscale image display. In a normally white mode, the transmissivity for incident light decreases according to a voltage applied to each pixel. In a normally black mode, the transmissivity for incident light increases according to a voltage applied to each pixel. Light having a contrast in accordance with an image signal is emitted from the electrooptical device. Herein, in order to prevent the held image signal from leaking, a storage capacitor 70 is added in parallel with the liquid-crystal capacitor to be formed between the pixel electrode 9a and the counter electrode 21. The storage capacitor 70 is formed between a high-concentration drain region 1e of the pixel switching TFT 30 that will be discussed below, and a constant-potential capacitance line 300 through a dielectric film 301.

In addition to the data-line drive circuit 101, the scanning-line drive circuit 104, the sampling circuit 118 and the like, the following structure may be formed on the substrate 10: a precharge circuit that supplies to the data lines 6a a precharge signal of a predetermined voltage level prior to supplying an image signal, and an inspection circuit that inspects for quality, defects, etc. of the electrooptical device during manufacturing or upon shipment and so on.

The TFT, having the same structure as the SOI-structured TFT 30 formed in the substrate device 200 shown in FIG. 1, can be utilized as a TFT for the above peripheral circuit in various kinds besides the pixel-switching TFT in the electrooptical device thus structured. Furthermore, the contact hole 282, connecting the first light shielding film 11a and the extension electrode 204 in the substrate device 200 shown in FIG. 1, is opened, e.g., in a peripheral region forming a peripheral circuit on the substrate 10 and used for connection to a constant-potential source for the peripheral circuit. The constant-potential source may be a positive or negative constant-potential source for supply to the scanning-line drive circuit and data-line drive circuit, or may be a constant-potential source for supply to the counter substrate. This structure can previously prevent the potential variation on the lower light shielding film 11a from having a bad effect upon the TFT 30 of each pixel.

(Electrooptical Device Pixel-Region Structure)

Figure 9:
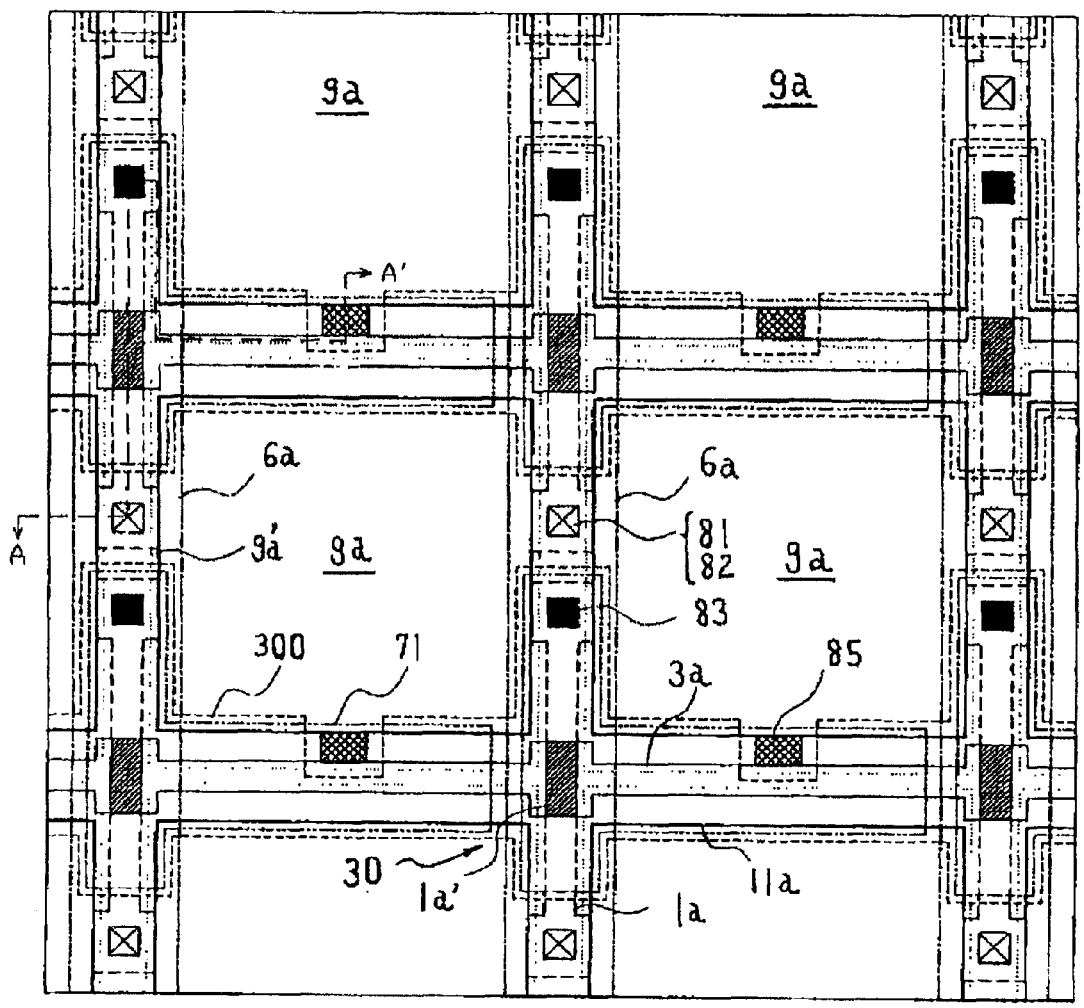
FIG. 9 is a plan view of a plurality of adjacent pixels on the TFT array substrate forming data lines, scanning lines, pixel electrodes and the like of the electrooptical device in the embodiment.
Figure 10:
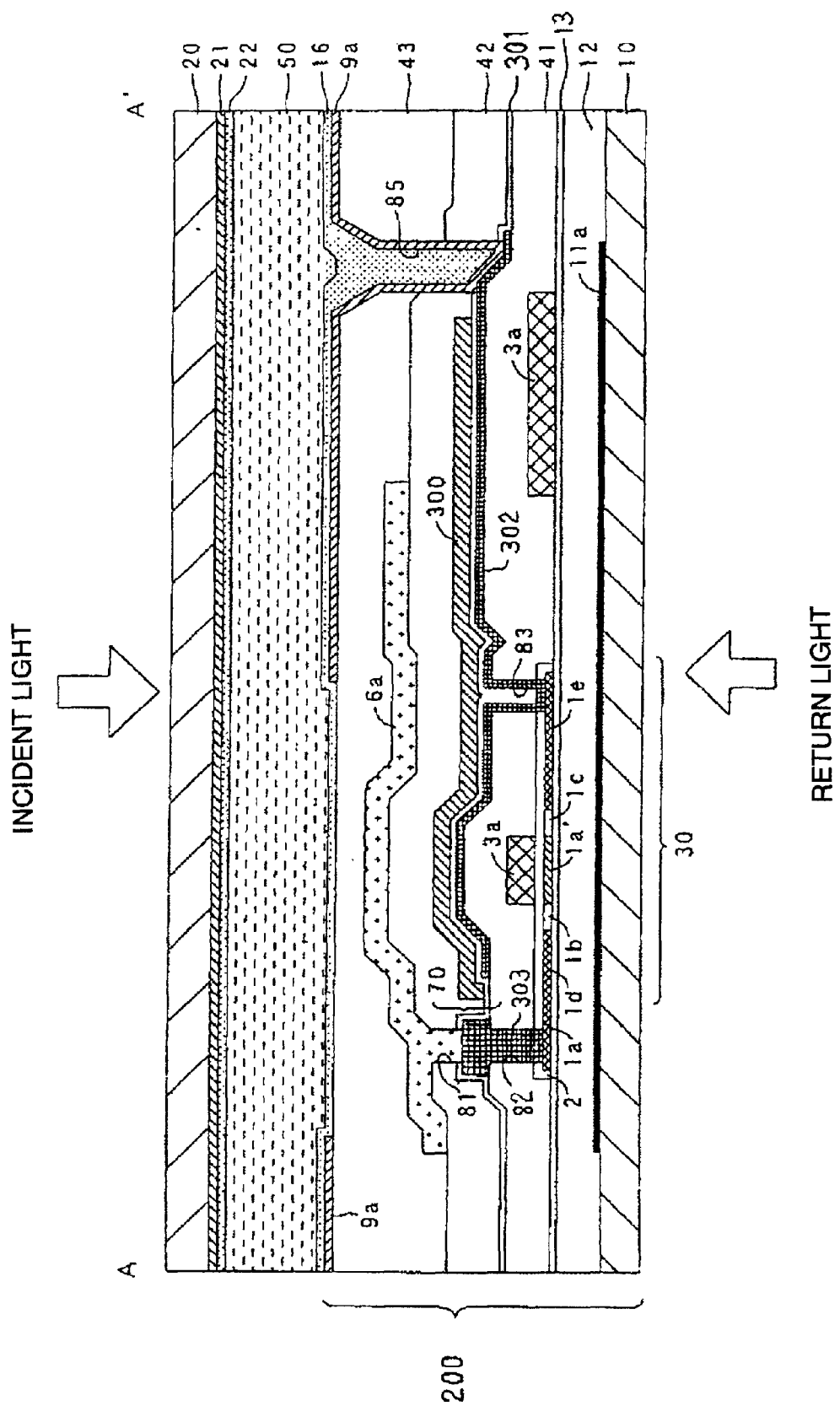
FIG. 10 is a sectional view taken along plane A–A' in FIG. 9.

An explanation is provided of the pixel-region structure of the electrooptical device of the embodiment, with reference to FIGS. 9 and 10. FIG. 9 is a plan view of a plurality of adjacent pixels of an electrooptical device formed with data lines, scanning lines, pixel electrodes and so on. FIG. 10 is a sectional view taken along plane A–A' in FIG. 9. In FIG. 10, the layers and members are based on different scales in order to depict the layers and members in a recognizable size in FIG. 10.

In FIG. 9, a plurality of transparent pixel electrodes 9a (contour being shown by dotted lines 9a') are provided in a matrix form on a substrate 10 of the electrooptical device. The data lines 6a and the scanning lines 3a are provided, respectively, along vertical and horizontal boundaries of the pixel electrodes 9a.

Meanwhile, the scanning line 3a is arranged so that it faces the channel region 1a' indicated as the rightward-downward-hatched channel region of the semiconductor layer 1a in the figure. The scanning line 3a serves as a gate electrode. In this manner, on each crossing point of the scanning line 3a and the data line 6a, a pixel-switching TFT 30 is provided having the scanning line 3a as a gate electrode arranged opposite to the channel region 1a'.

In the embodiment, the capacitance line 300 is formed so that it is superposed over the scanning line 3a formed region, as shown by bold lines in the figure. More specifically, the capacitance line 300 has a line body portion extending along the scanning line 3a, a projecting portion projecting up along the data line 6a at each point crossing with the data line 6a and a tying portion slightly tying at a point corresponding to a contact hole 84.

As shown in FIGS. 9 and 10, the pixel electrode 9a is connected to the high-concentration drain region 1e through the contact holes 83 and 85 via the drain electrode 302, serving also as a conductive film for connection between the pixel electrode 9 and the high-concentration drain region 1e. The data line 6a is connected to the high-concentration source region 1d through the contact holes 81 and 82 via the source electrode 303, serving also as a conductive film for connection between the data line 6a and the high-concentration source region 1d.

The capacitance line 300, including the fixed-potential capacitance electrode, is formed on the pixel-potential capacitance electrode formed by a part of the drain electrode 302 with the dielectric film 301 interposed therebetween. The capacitance line 300 is formed of a single-metal, an alloy, a metal silicide, a polycide or a lamination thereof, including at least one of refractory metals, e.g., Ti, Cr, W, Ta and Mo. In this embodiment, a storage capacitor 70 is built so that a part of the drain electrode 302 faces a part of the capacitance line 300 with the dielectric film 301 interposed therebetween.

On the capacitance line 300, the second interlayer insulating film 42 is formed, in which a contact hole 81 communicating between the source electrode 303 and the data line 6a, and a contact hole 85 communicating between the drain electrode 302 and the pixel electrode 9a, are formed. The second interlayer insulating film 42 is formed, for example, of a silicate glass film, a silicon nitride film or a silicon oxide film, and has a film thickness, e.g., of approximately 500–2000 nm.

The data line 6a is formed on the second interlayer insulating film 42, on which the third interlayer insulating film 43 with the contact hole 85 to the drain electrode 302 provided, is further formed. The data line 6a is formed of a low-resistance metal film of Al (aluminum) or the like to have a predetermined pattern, for example, by sputtering, photolithography or etching. The film has a thickness of, for example, approximately several hundred nm in order to provide a required conductivity according to an interconnection width. On the other hand, the third interlayer insulating film 43 is formed, for example, of a silicate glass film, a silicon nitride film or a silicon oxide film, and has a film thickness of approximately 500–2000 nm.

The pixel electrode 9a is provided on an upper surface of the third interlayer insulating film 7 thus formed. The pixel electrode 9a is formed from a transparent conductive film, such as an ITO (Indium Thin Oxide) film, e.g., by sputtering, photolithography or etching. An alignment film that has been rubbed may be formed as in an electrooptical device discussed below.

The data line 6a is electrically connected, by way of the source electrode 303, to the semiconductor layer 1a at its high-concentration source region 1d through the contact hole 81 and contact hole 82. On the other hand, the pixel electrode 9a is electrically connected to a high-concentration drain region 1e of the semiconductor layer 1a through the contact holes 83 and 85, by way of utilizing, as an interlevel-connecting layer, the drain electrode 302 formed by the same film as the source electrode 303.

By thus utilizing the drain electrode 302 as an interlevel-connecting layer, even where the interlayer distance between the pixel electrode 9a and the semiconductor layer 1a forming the TFT 30 is long, e.g., approximately 1000 nm, both structures can be favorably connected by the two contact holes 83 and 84, which are comparatively small in diameter and arranged in series, while avoiding the technical difficulty in connecting between them by one contact hole, thereby making it possible to enhance the pixel opening ratio. Particularly, the use of such an interconnect layer helps reduce or prevent the penetration of etching during the process of opening a contact hole. Similarly, by using the source electrode 303, even where the interlayer distance is long between the data line 6a and the semiconductor layer 1a forming the TFT 30, both structures can be favorably connected by the two contact holes 81 and 82 that are comparatively small in diameter and arranged in series, while avoiding the technical difficulty in connecting between them by one contact hole.

As shown in FIGS. 9 and 10, by arranging the drain electrode 302 so that it faces the capacitance line 300 with the dielectric film 301 interposed therebetween, the storage capacitor 70 is built in the region overlapped the scanning line 3a, and in the region overlapped the data line 6a in plan view.

In other words, the capacitance line 300 extends so that it covers the scanning line 3a and has, in a region beneath the data line 6a, a projecting portion projecting in a manner covering the drain electrode 302 thus being formed in a comb form. The drain electrode 302 forms an L-island capacitance electrode having one end extending along the projecting portion of the capacitance line 300 in the region beneath the data line 6a from the intersection of the scanning line 3a and data line 6a, and the other end extending along the capacitance line 300 in the region above the scanning line 3a to the vicinity of adjacent data line 6a. The storage capacitor 70 is formed in the region where the L-shaped drain electrode 302 is overlapped the capacitance line 300, with the dielectric film 301 interposed therebetween.

The drain electrode 302, including one capacitance electrode of the storage capacitor 70, is connected to the pixel electrode 9a through the contact hole 85, and to the high-concentration drain region 1e through the contact hole 83, and has a pixel-electrode potential.

The capacitance line 300, including the other capacitance electrode of the storage capacitance 70, extends from the pixel display region, in which the pixel electrodes 9a are arranged, to the periphery thereof and electrically connected to a constant potential source, and has a fixed potential. The constant potential source may be a positive or negative constant potential source for supply to the scanning-line drive circuit to supply to the scanning line 3a a scanning signal to drive a TFT, or to the data-line drive circuit to control the sampling circuit supplying an image signal onto the data line 6a, or may be a constant potential to be supplied to the opposing substrate.

The dielectric film 301 of the storage capacitor 70 is formed of a silicon oxide film, a silicon nitride film or the like, such as an HTO film (high-temperature oxide film) or an LTO film (low-temperature oxide film), having a comparatively small thickness, e.g., a film thickness of approximately 5–200 nm. The dielectric film 301 may be a thermal oxide film obtained by oxidizing the surface of the drain electrode 302. From the viewpoint of increasing the capacitance of the storage capacitor 70, the dielectric film 301 is desirably smaller in thickness as long as the reliability in film thickness is fully achieved.

As shown in FIG. 10, the electrooptical device has the electrooptical substrate device 200 and the transparent opposing substrate 20 that is disposed opposite the substrate device 20. The opposing substrate 20 is formed, for example, of a glass substrate or a quartz substrate. The substrate 10 has a pixel electrode 9a on which an alignment film 16 that is subjected to predetermined orientation process is provided, such as rubbing. Meanwhile, the alignment film 16 is formed of an organic film of polyimide or the like.

On the other hand, the opposing substrate 20 has the opposing electrode 21 provided across the surface thereof, and under the opposing electrode an alignment film 22 subjected to predetermined orientation process is provided, such as rubbing. The opposing electrode 21 is a transparent conductive film, e.g., of ITO. Meanwhile, the alignment film 22 is an organic film of polyimide or the like.

A pixel-switching TFT 30 is provided on the substrate 10 at a position adjacent to each pixel electrode 9a in order to switch the pixel electrode 9a.

On the opposing substrate 20, a light shielding film may further be provided. With such a structure, it is possible to suppress incident light from entering from the side of the opposing substrate 20 into the channel region 1a' of the semiconductor layer 1a of the TFT 30, or into the low-concentration source region 1b and low-concentration drain region 1c thereof. Furthermore, the light shielding film on the opposing substrate, if formed on a surface to be radiated by incident light by the use of a highly reflective film, serves to prevent against temperature rise of the electrooptical device.

Incidentally, in the embodiment, the region extending along the data line 6a of light shielding area at each pixel may be shielded by a light shielding data line 6a of Al or the like. Alternatively, by forming the capacitance line 300 of a light shielding film, the channel region 1a' can be shielded from light.

A liquid crystal, as an example of an electrooptical substance, is filled between the substrate 10 having the pixel electrodes 9a arranged facing the opposing electrode 21 and the opposing substrate 20, in a space surrounded by the seal member, thereby forming a liquid crystal layer 50. The liquid crystal layer 50 assumes a predetermined orientation in a state in which no electric field is applied from the pixel electrode 9a.

In the embodiment explained above, by lying many conductive films on top of each other, steps will be created in the regions along the data line 6a and scanning line 3a. However, a planarizing process may be performed by forming a trench in the first interlayer insulating film 41 and second interlayer insulating film 42 to bury therein the interconnections of the data line 6a, TFT 30 and the like. Alternatively, such a planarizing process may be performed by polishing the step on the upper surface of the third interlayer insulating film 43 and second interlayer insulating film 42 through a CMP process, or by using organic SOG for planarization.

Furthermore, in the embodiment explained above, the pixel-switching TFT 30 preferably has an LDD structure, as shown in FIG. 10. However, it may have an offset structure that no impurity implantation is made to the low-concentration source region 1b and low-concentration drain region 1c, or may be a self-aligned TFT, in which the gate electrode, formed by a part of the scanning line 3a, is used as a mask to implant an impurity at high concentration, thereby forming a high-concentration source and drain regions in a self-aligned fashion. Meanwhile, the embodiment is of a single-gate structure, where only one gate electrode of the pixel-switching TFT 30 is arranged between the high-concentration source region 1d and the high-concentration drain region 1e. However, two or more gate electrodes may be arranged between them. The TFT, if structured with dual, triple or more gates in this manner, enables a reduction or prevention of the leak current at the junction between the channel, source and drain regions, making it possible to reduce the current during an OFF state. The TFTs for the peripheral circuits can be built by various kinds of TFTs in the similar way.

In the embodiment explained with reference to FIGS. 1 to 10, a data-line drive circuit 101 and scanning-line drive circuit 104 may be electrically and mechanically connected to a driving LSI mounted, e.g., on TAB (Tape Automated Bonding) through an anisotropic conductive film provided in the periphery of the substrate 10, in place of being provided on a TFT array substrate 10. Meanwhile, a polarizing film, a retardation film, a polarizing plate and the like are arranged in predetermined directions, depending on an operation mode, such as TN (Twisted Nematic) mode, VA (Vertically Aligned) mode and PDLC (Polymer Dispersed Liquid Crystal) mode or normally-white mode/normally-black mode on each of the side of the opposing substrate 20 where projection light enters and the side of the substrate 10 where emergent light emerges.

Since the electrooptical device in each embodiment explained above is applied to a projector, three electrooptical devices are used respectively as RGB light valves, where the respective colors of light dissolved through RGB-color-separation dichroic mirrors fall on the light valves as projection light. Accordingly, each embodiment does not have a color filter on the opposing substrate 20. However, an RGB color filter may be formed together with its protection film on the opposing substrate 20 in a predetermined region facing the pixel electrode 9a where the opposing substrate has no light shielding film formed thereon. This makes it possible to apply the electrooptical device of each embodiment to a direct-viewing type or reflection-type color electrooptical deivce other than a projector. Meanwhile, microlenses may be formed in a correspondence of one pixel to one thereof on the opposing substrate 20. Alternatively, it is possible to form a color filter layer of color resist or the like in a position beneath the pixel electrodes 9a facing the RGB on the TFT array substrate 10. This enhances the efficiency of focusing incident light, thereby realizing a bright electrooptical device. Furthermore, by depositing many of interference layers different in refractive index on the opposing substrate 20, a dichroic filter may be formed to produce RGB colors by utilizing light interference. The opposing substrate having a dichroic filter realizes brighter color electrooptical device.

(Manufacturing Method for Peripheral-Region Substrate Device)

Figure 11:
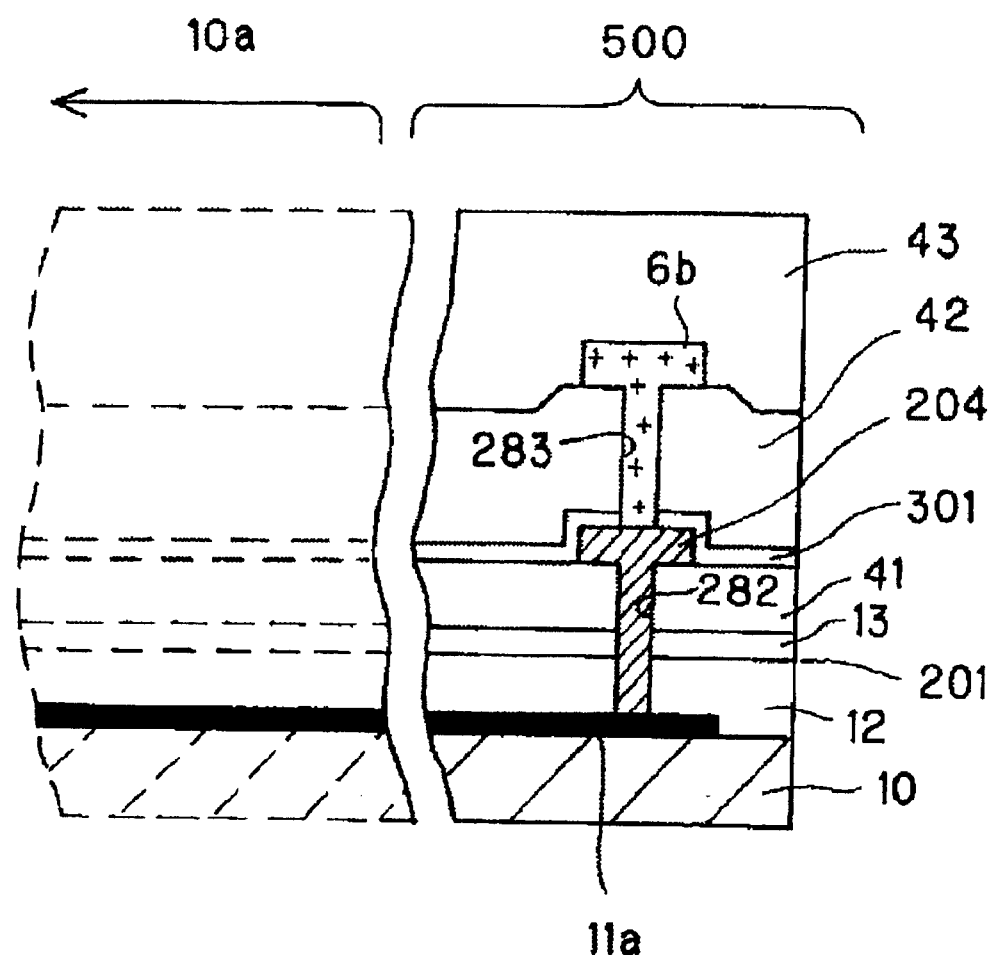
FIG. 11 is a sectional view showing a structure in the vicinity of a contact hole of the substrate device in the peripheral region.

Next, an explanation is provided of an embodiment of a manufacturing method for a substrate device in a peripheral region to be suitably used in the electrooptical device in the foregoing embodiment, with reference to FIGS. 11 and 12(a)–12(d). Herein, FIG. 11 is a sectional view showing a manner in the vicinity of a contact hole of a substrate device in a peripheral region. FIGS. 12(a)–12(d) are sectional views showing, in the sections corresponding to FIG. 11, a manufacturing method for a substrate device in a peripheral region. Note that, in FIGS. 11 and 12(a)–12(d), the same constituent elements as the constituent elements shown in FIGS. 1 to 3 and 10 are denoted with the same reference numerals, and an explanation thereof is omitted.

As shown in FIG. 11, this embodiment relates to a process of electrically connecting a light shielding film 11a as an example of a first conductive film, and an extension electrode 204 as an example of a second conductive film through a contact hole 282 in the peripheral region 500 on the substrate 10 that is positioned in a periphery of the image display region 10a, and in which a scanning-line drive circuit 104, data-line drive circuit 101 and the like shown in FIGS. 6 to 8 will be fabricated.

Next, an explanation is provided of a manufacturing method for a substrate device in a peripheral region including a structure as shown in FIG. 11, along with the sectional views of FIGS. 12(a)–12(d).

Figure 12:
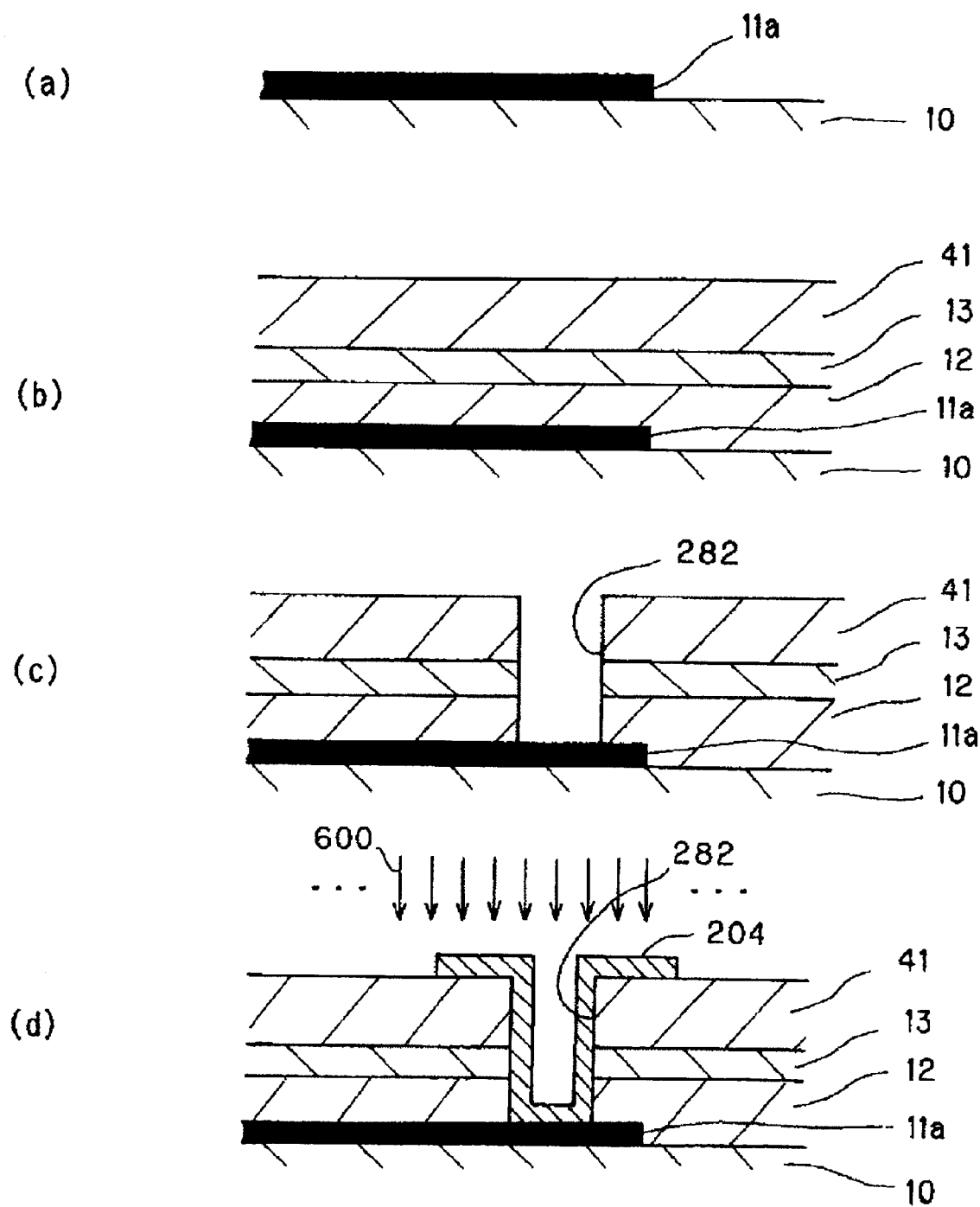
FIGS. 12(a)–12(d) are sectional views showing processes of a manufacturing method for a substrate device in the peripheral region.

As shown in FIG. 12(a), a refractory metal film, as a conductive light shielding film and the like, are first formed on the substrate 10 by a sputtering process, a CVD process or the like, and thereafter patterned by photolithography and etching to form a light shielding film 11a of a predetermined pattern. Subsequently, as shown in FIG. 12(b), a first underlying insulating film 12, second underlying insulating film 13 and first interlayer insulating film 41, serving as an interlayer insulating film in the peripheral region, is formed by the use of a bonding technique or the like in a similar manner as shown in FIG. 2. Subsequently, as shown in FIG. 12(c), a contact hole 282 is opened in the three insulating films in a similar manner as shown in FIG. 3.

Next, as shown in FIG. 12(d), a material film, e.g., of polysilicon to be formed into an extension electrode 204 is formed on the first interlayer insulating film 41 in which the contact hole 282 is formed by a CVD process, a sputtering process or the like. Subsequently, ions 600 are implanted in the material film in around the timing of patterning the material film by an ion implant process, thereby reducing the resistance thereof. For example, by implanting ions 600 of B (boron) at an acceleration of 25 Kev with a dose at a comparative high concentration of approximately $10^{15}/cm^2$ using a diborane gas, a favorable conductivity can be obtained as an extension electrode 204.

As the material film for an extension electrode 204, a non-doped silicon film, or a doped silicon film introduced with ions simultaneously with the deposition thereof, may be used. In the latter case, an extension electrode 204 can be formed having a further reduced resistance or a desired resistance value by the ion implant process.

This embodiment preferably forms, in this manner, a drain electrode 302 and source electrode 303 structuring a pixel-switching TFT 30 shown in FIG. 10 in the same process and from the same layer as forming an extension electrode 204 from a polysilicon film. On this occasion, when the high-concentration drain region 1e and high-concentration source region 1d of the semiconductor layer 1a is a $P^+$ type, it is preferable that the extension electrode 204 and the drain electrode 302 and source electrode 303 are formed in the same type, i.e., $P^+$ type. Alternatively, where the high-concentration drain region 1e and high-concentration source region 1d of the semiconductor layer 1a is an $N^+$ type, it is preferable that the extension electrode 204 and the drain electrode 302 and source electrode 303 be formed in the same type, i.e. $N^+$ type. There is thus no need to build a PN junction in the pixel switching TFT 30 at its junction plane between the drain electrode 302 and the high-concentration drain region 1e, and at its junction plane between the source electrode 303 and the high-concentration source region 1d, thus obtaining favorable electrical connection.

As described above, according to the manufacturing method of this embodiment, the material film at the inside of the contact hole 282 can be comparatively easily reduced in resistance in the peripheral region to form an extension electrode 204. As a result, favorable electrical connection can be established between the extension electrode 204 and the ligh shielding film 11a, through the contact hole 282. It is possible to build peripheral circuits shown in FIG. 8, such as a scanning-line drive circuit 104, a data-line drive circuit 101, a sampling circuit 118 and an image signal line 115. Moreover, favorable electrical connection can be obtained, at the same time, in the drain electrode 302 and source electrode 303 in the pixel-switching TFT 30.

(Embodiment of Electronic Unit)

Next, an explanation is provided of the overall structure, particularly optical structure, of an embodiment of a projection-type color display apparatus as an example of an electronic unit using the electrooptical device explained in detail above. Herein, FIG. 13 is a schematic of a projection-type color display unit.

Figure 13:
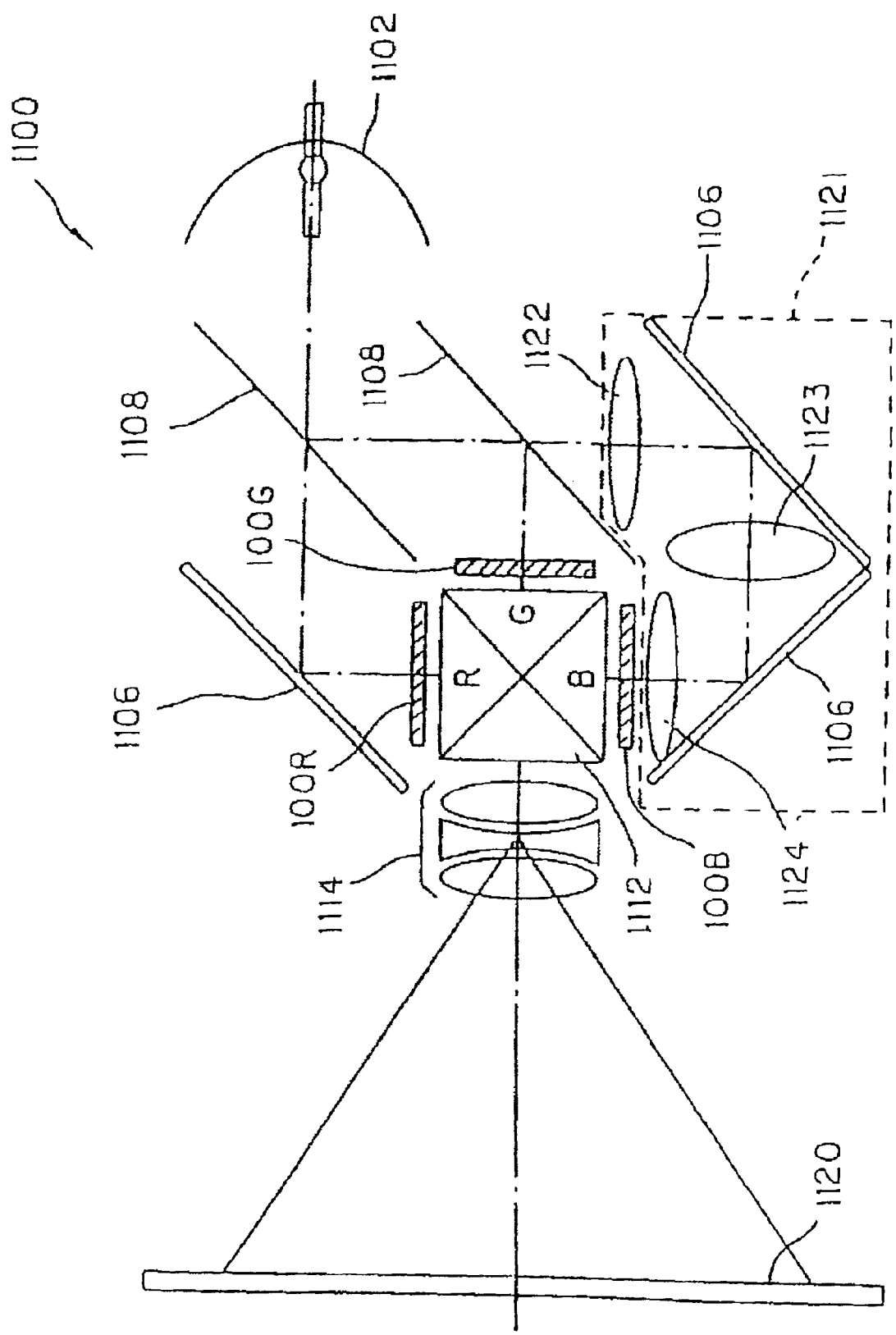
FIG. 13 is a schematic showing a color liquid-crystal projector as an example of a projection-type color display device in an embodiment of an electronic appliance of the invention.

FIG. 13 shows a liquid crystal projector 1100 as an example of a projection-type color display unit of the embodiment as a projector that uses, as RGB light valves 100R, 100G and 100B, three liquid crystal modules, each including a liquid crystal device 100 having the drive circuit mounted on the TFT array substrate. In the liquid crystal projector 1100, where projection light is emitted from white-light source lamp unit 1102, such as a metal halide lamp, the projection light is separated into light components R, G, B corresponding to RGB three primary colors by three mirrors 1106 and two dichroic mirrors 1108. The light components are respectively guided to the light valves 100R, 100G and 100B corresponding to the respective colors. On this occasion, light B particularly is guided through a relay lens system 1121 including an incident lens 1122, a relay lens 1123 and an emission lens 1124 in order to reduce or prevent optical loss due to a long optical path. The light component corresponding to three primary colors respectively modulated by the light bulbs 100R, 100G and 100B are re-combined together by a dichroic prism 1112, and then projected as a color image onto a screen 1120 through a projection lens 1114.

The present invention is not limited to the foregoing embodiments, but can be modified within a scope not countering to the gist or idea of the invention to be read from the entire claim and description, to include such a modified manufacturing method for an electrooptical substrate device and such a substrate device, a manufacturing method for an electrooptical device and such an electrooptical device, and an electronic unit having the same, within the technical scope of the invention.

What is claimed is:

1. An electronic unit, comprising:
    an electrooptical device, including:
        a substrate device, comprising, on a substrate,
        a first conductive film,
        a first insulating film formed over said first conductive film,
        a second insulating film bonded on said first insulating film,
        a conductive silicon film formed above said second insulating film, and
        a contact hole opened in said first and second insulating films to connect said first conductive film and said conductive silicon film, the contact hole penetrating through a bonding interface between said first insulating film and said second insulating film, a portion in said contact hole penetrating through said bonding interface not being eroded by an etch solution;
    an opposing substrate arranged opposite said substrate device; and
    an electrooptical substance sandwiched between said opposing substrate and said substrate device.

2. A substrate device comprising, above a substrate:
    an image display region;
    a first conductive film;
    a first insulating film formed over said first conductive film;
    a second insulating film bonded on said first insulating film;
    a conductive silicon film formed above said second insulating film; and
    a contact hole opened at least in said first and second insulating films to connect said first conductive film and said conductive silicon film in said image display region above said substrate, said contact hole penetrating through a bonding interface between said first insulating film and said second insulating film, a portion in said contact hole penetrating through said bonding interface not being eroded by an etch solution.

3. A substrate device comprising, above a substrate:
    an image display region;
    a first conductive film;
    a first insulating film formed over said first conductive film;
    a second insulating film bonded on said first insulating film;
    a conductive silicon film formed above said second insulating film; and a contact hole opened at least in said first and second insulating films to connect said first conductive film and said conductive silicon film in a peripheral region positioned in a periphery of said image display region above said substrate, said contact hole penetrating through a bonding interface between aid first insulating film and said second insulating film, a portion in said contact hole penetrating through said bonding interface not being eroded by an etch solution.

4. A substrate device comprising, above a substrate:

an image display region;

a first conductive film;

a first insulating film formed over said first conductive film;

a second insulating film bonded on said first insulating film;

a second conductive film formed above said second insulating film; and a contact hole opened at least in said first and second insulating films to connect said first conductive film and said conductive film in said image display region, said contact hole penetrating through a bonding interface between said first insulating film and said second insulating film, said opening of a contact hole being initiated after forming said bonding interface, a portion in said contact hole penetrating through said bonding interface not being eroded by an etch solution.

5. A substrate device comprising, above a substrate:

an image display region;

a first conductive film;

a first insulating film formed over said first conductive film;

a second insulating film bonded on said first insulating film;

a second conductive film formed above said second insulating film; and a contact hole opened at least in said first and second insulating films to connect said first conductive film and said second conductive film in a peripheral region positioned in a periphery of said image display region above said substrate, said contact hole penetrating through a bonding interface between said first insulating film and said second insulating film, said opening of a contact hole being initiated after forming said bonding interface, a portion in said contact hole penetrating through said bonding interface not being eroded by an etch solution.

6. The substrate device according to claim 3, further comprising a semiconductive film above said second insulating film and an interlayer insulating film above said semiconductive film, said conductive silicon film being formed above said interlayer insulating film, a channel region, a source region and a drain region being formed in said semiconductive film to build a thin film transistor, said contact hole being opened penetrating through said interlayer insulating film, said second insulating film and said first insulating film.

7. A substrate device, comprising:

a substrate;

a first conductive film;

a first insulating film formed over said first conductive film;

a second insulating film bonded over said first insulating film;

a second conductive film formed over said second insulating film;

a contact hole opened in said first and second insulating films to connect said first conductive film and said conductive film, the contact hole penetrating through a bonding interface between said first insulating film and said second insulating film, a portion in said contact hole penetrating through said bonding interface being not eroded by an etch solution;

a semiconductor layer formed over said second insulating film;

an interlayer insulating film formed over said semiconductor layer; and a storage capacitor formed over said interlayer insulating film, the storage capacitor including a pixel-potential capacitance electrode and a fixed-potential capacitance electrode.

8. The substrate device according to claim 2, further comprising a semiconductor film above said second insulating film and an interlayer insulating film above said semiconductor film, said conductive silicon film being formed above said interlayer insulating film, a channel region, a source region and a drain region being formed in said semiconductor film to build a thin film transistor, said contact hole being opened penetrating through said interlayer insulating film, said second insulating film and said first insulating film.

9. The substrate device according to claim 8, said first conductive film being formed by a light shielding conductive film in a region of said semiconductor film facing at least said channel region on said substrate.

10. The substrate device according to claim 2, further including, above said substrate, a pixel electrode, an intermediate conductive film to connect between said pixel electrode and a semiconductor layer, and including a pixel-potential capacitance electrode, and a capacitance line including a fixed-potential capacitance electrode disposed opposite said pixel-potential capacitance electrode with a dielectric film interposed therebetween, a storage capacitor being connected to said pixel electrode.

11. The substrate device according to claim 10, one of said intermediate conductive film and said capacitance line being formed by the same layer as said conductive silicon film.

12. The substrate device according to claim 10, at least one of said intermediate conductive film and said capacitance line being formed by a conductive light shielding film, and including a portion covering said channel region at above thereof above said substrate.

13. The substrate device according to claim 10, further including, above said substrate, a scanning line connected to a gate electrode formed on said channel region, with a gate insulating film interposed therebetween, a data line connected to the other of said source region and said drain region, and another intermediate conductive film to connect between said data line and the other of said source region and said drain region, and formed by the same layer as said conductive silicon film.

14. The substrate device according to claim 3, said storage capacitor being partly provided at least in a region overlapping said scanning line in plan view.

15. The substrate device according to claim 13, said storage capacitor being partly provided at least in a region overlapping said data line in plan view.

16. An electrooptical device, comprising:

a substrate device according to claim 2;

an opposing substrate arranged opposite said substrate device; and an electrooptical substance sandwiched between said opposing substrate and said substrate device.

17. The electrooptical device, comprising:

the substrate device according to claim 3, further including at least one of a first interconnection and an electrode formed of said first conductive film, and at least one of a second interconnection and an electrode formed of said conductive silicon film, in a peripheral region positioned in a periphery of an image display region above said substrate arranged with said electrooptical substance, said contact hole connecting said at least one of the first interconnection and the electrode, and said at least one of the second interconnection and the electrode to each other in said peripheral region.

18. The electrooptical device according to claim 3, further including a peripheral circuit fabricated in a peripheral region positioned in a periphery of an image display region above said substrate arranged with said electrooptical substance, said peripheral circuit including said first conductive film, said conductive silicon film and said contact hole.

* * * * *